(12) United States Patent
Menassa et al.

(10) Patent No.: US 8,813,347 B2
(45) Date of Patent: Aug. 26, 2014

(54) METHOD OF MANUFACTURING A LOAD CELL ASSEMBLY AND METHODS OF FOLDING A CIRCUIT DEVICE

(75) Inventors: Roland J. Menassa, Macomb, MI (US); Pamela R. Patterson, Los Angeles, CA (US); Geoffrey P. McKnight, Los Angeles, CA (US); Guillermo A. Herrera, Winnetka, CA (US); Hung D. Nguyen, Los Angeles, CA (US); Douglas Martin Linn, White Lake, MI (US); Chris A. Ihrke, Hartland, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 186 days.

(21) Appl. No.: 13/589,220

(22) Filed: Aug. 20, 2012

(65) Prior Publication Data

US 2013/0326863 A1    Dec. 12, 2013

Related U.S. Application Data

(60) Provisional application No. 61/657,345, filed on Jun. 8, 2012.

(51) Int. Cl.
  *H01C 17/28* (2006.01)

(52) U.S. Cl.
  USPC ... 29/621.1; 29/592.1; 29/602.1; 73/862.041; 73/862.045; 73/862.632

(58) Field of Classification Search
  USPC ................................. 29/592.1, 602.1, 621.1; 73/862.041–862.045, 865.67, 862, 632
  See application file for complete search history.

(56) References Cited

U.S. PATENT DOCUMENTS

| | | | | |
|---|---|---|---|---|
| 4,520,339 A | * | 5/1985 | Utsunomiya | 338/5 |
| 5,014,799 A | * | 5/1991 | Sato et al. | 177/211 |
| 6,483,713 B2 | * | 11/2002 | Samant et al. | 361/749 |
| 7,408,253 B2 | * | 8/2008 | Lin | 257/686 |
| 7,784,363 B2 | | 8/2010 | Ihrke et al. | |
| 8,186,232 B2 | * | 5/2012 | McDearmon et al. | 73/862.632 |

* cited by examiner

*Primary Examiner* — Paul D Kim
(74) *Attorney, Agent, or Firm* — Quinn Law Group, PLLC

(57) ABSTRACT

A method of manufacturing a load cell assembly and methods of folding a circuit device are disclosed. A flexible circuit body including a strip having at least one hinge is provided, with the strip being in a first position or an unfolded position. A plurality of strain gauges are attached to the strip, with the hinge disposed between the strain gauges. A jig is provided and the strip of the flexible circuit body is folded along the hinge utilizing the jig to define a second position or folded position of the strip.

20 Claims, 14 Drawing Sheets

METHOD OF MANUFACTURING A LOAD CELL ASSEMBLY AND METHODS OF FOLDING A CIRCUIT DEVICE

CROSS-REFERENCE TO RELATED APPLICATIONS

This application claims the benefit of U.S. Provisional Application No. 61/657,345, filed on Jun. 8, 2012, which is hereby incorporated by reference in its entirety.

TECHNICAL FIELD

The present disclosure relates to a method of manufacturing a load cell assembly and methods of folding a circuit device.

BACKGROUND

Various robots have been developed over the years. Some robots have robotic fingers to grasp an object. These robotic fingers can have strain gauges attached to a strain element to measure a load applied to the respective robotic fingers when grasping the object. Generally, each of the strain gauges are individually attached to the strain element. Attaching each of these strain gauges to sides of the strain element is time consuming and tedious due to hand aligning the strain gauges on the strain element. Furthermore, free-standing or exposed wires are soldered to each of the strain gauges which is time consuming and laborious. In addition, the free-standing wires could be damaged during assembly or operation of the robotic fingers.

SUMMARY

The present disclosure provides a method of manufacturing a load cell assembly. A flexible circuit body is provided including a strip having a plurality of hinges, with the strip being in a first position. A plurality of strain gauges are attached to the strip to define a circuit device, with one of the hinges disposed between each of the strain gauges. A first jig is provided including a mid-portion and a finger extending from the mid-portion to define a first pattern. The circuit device abuts the mid-portion of the first pattern, with the strip remaining in the first position. The strip of the flexible circuit body is folded about the finger along at least one of the hinges to define a second position of the strip. The circuit device is removed from the first jig, with the strip remaining in the second position. In addition, a second jig is provided including a bottom part defining a second pattern. A support is provided including a first portion, a second portion and a bridge disposed between the first and second portions. The strip is guided in the second position about the bridge of the support. The circuit device is sandwiched between the support and the second pattern of the bottom part such that the flexible circuit body abuts at least one of the first and second portions of the support, with the strip remaining in the second position about the bridge. The strip is folded about the bridge along another one of the hinges to define a third position of the strip such that the strip is wrapped about the bridge when in the third position to align the strain gauges about the bridge and to attach the circuit device and the support to each other to define the load cell assembly.

The present disclosure also provides a method of folding a circuit device. A flexible circuit body is provided including a strip having a hinge, with the strip being in a first position. A plurality of strain gauges are attached to the strip to define the circuit device, with the hinge disposed between a pair of the strain gauges. A jig is provided including a mid-portion and a finger extending from the mid-portion to define a pattern. The flexible circuit body abuts the mid-portion of the pattern, with the strip remaining in the first position. The strip of the flexible circuit body is folded about the finger along the hinge to define a second position of the strip. The flexible circuit body, including the strain gauges, is removed from the jig, with the strip remaining in the second position.

The present disclosure further provides another method of folding a circuit device. A flexible circuit body is provided including a strip having a plurality of hinges, with the strip being in an unfolded position. A plurality of strain gauges are attached to the strip to define the circuit device, with one of the hinges disposed between each of the strain gauges. A jig is provided including a bottom part defining a pattern. Furthermore, a support is provided including a first portion, a second portion and a bridge disposed between the first and second portions. The flexible circuit body, including the strain gauges, is sandwiched between the support and the pattern of the bottom part such that the flexible circuit body abuts at least one of the first and second portions of the support. The strip is folded about the bridge along at least one of the hinges as the flexible circuit body is sandwiched between the support and the pattern of the bottom part to define a first folded position of the strip. The strip is folded along another one of the hinges to define a second folded position of the strip such that the strip is wrapped about the bridge when in the second folded position to align the strain gauges about the bridge and to attach the flexible circuit body and the support to each other to define a load cell assembly.

The detailed description and the drawings or Figures are supportive and descriptive of the disclosure, but the scope of the disclosure is defined solely by the claims. While some of the best modes and other embodiments for carrying out the claims have been described in detail, various alternative designs and embodiments exist for practicing the disclosure defined in the appended claims.

DETAILED DESCRIPTION

Referring to the Figures, wherein like numerals indicate like or corresponding parts throughout the several views, a load cell assembly 20 is generally shown in FIGS. 1-4. The present disclosure also provides a method 1000 of folding a circuit device 22 (see FIGS. 6, 7 and 15) and another method 2000 of folding the circuit device 22 (see FIGS. 8-13 and 16). Furthermore, the present disclosure provides a method 3000 of manufacturing the load cell assembly 20 (see FIGS. 6-13 and 17).

Figure 1:
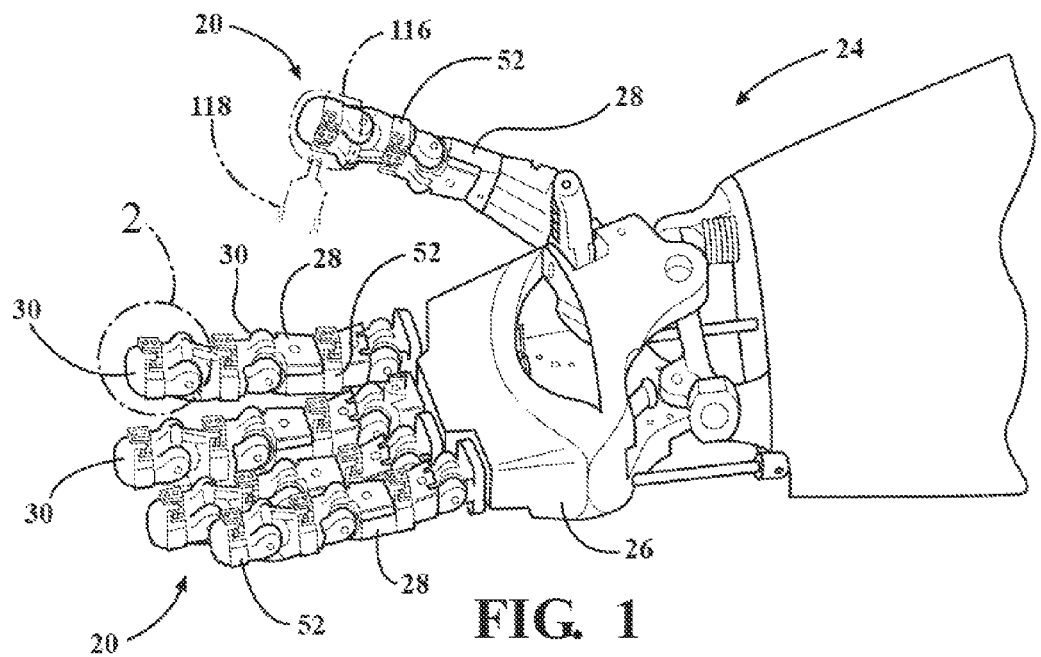
FIG. 1 is a schematic perspective view of a plurality of load cell assemblies attached to robotic fingers.

Referring to FIG. 1, in certain embodiments, the load cell assembly 20 is attached to a robotic member 24 and measures a load or strain applied to the robotic member 24. In other words, the robotic member 24 can perform a task, such as grasp an object, and therefore, the load or strain applied to the robotic member 24 while grasping that object can be measured. The load cell assembly 20 can measure loads or strains in six-degrees of freedom as will be discussed further below.

Figure 2:
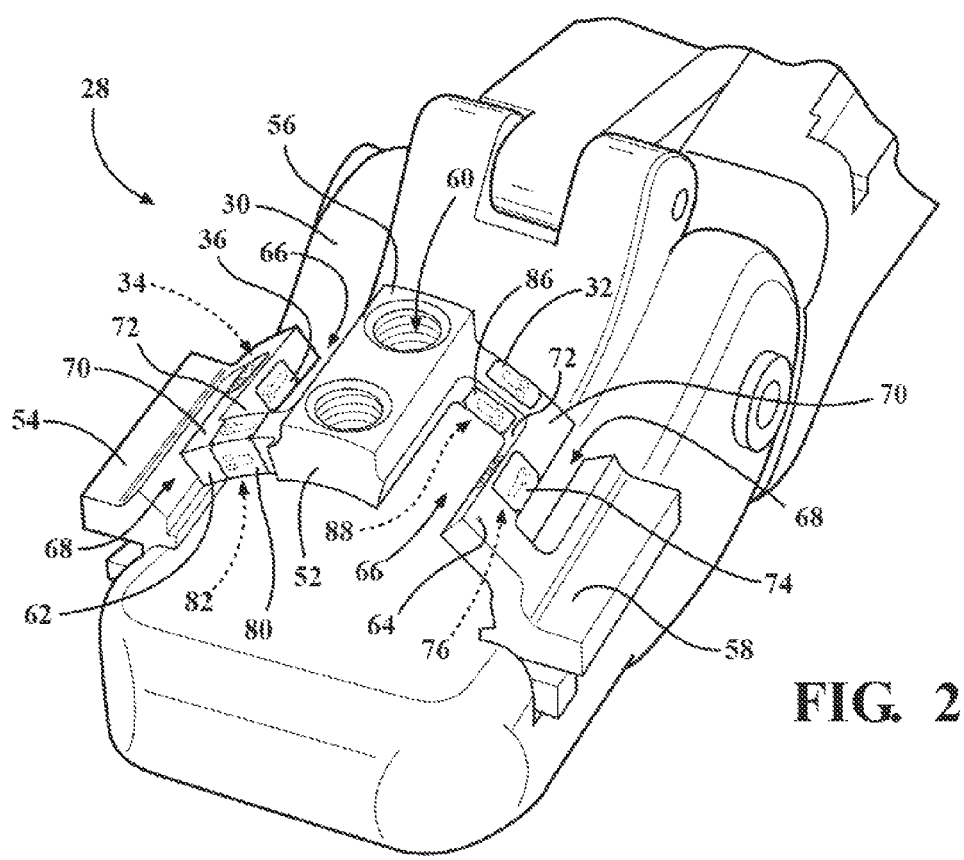
FIG. 2 is a schematic enlarged perspective view of one load cell assembly taken from FIG. 1.

In various embodiments, the robotic member 24 can be a hand 26 including one or more fingers 28. For example, in certain embodiments, the load cell assembly 20 can be attached to a phalange 30 of the finger 28, as shown in FIGS. 1 and 2, for measuring the load or strain on the respective phalange 30. It is to be appreciated that the robotic member 24 can be a foot including one or more toes, an arm, a leg, a clamp, etc. It is to further be appreciated that the load cell assembly 20 can be attached to any suitable member for measuring the load or strain on that member. It is to be appreciated that the load cell assembly 20 can be utilized to measure the load or strain on members other than the robotic member 24.

Referring to FIG. 1, the load cell assembly 20 can be further defined as a plurality of load cell assemblies 20 attached to the robotic member 24. Specifically, a plurality of load cell assemblies 20 can be attached to each of the fingers 28. For example, as shown in FIG. 1, one load cell assembly 20 is attached to each of the phalanges 30 of each of the fingers 28. It is to be appreciated that any suitable number of load cell assemblies 20 can be utilized.

Figure 3:
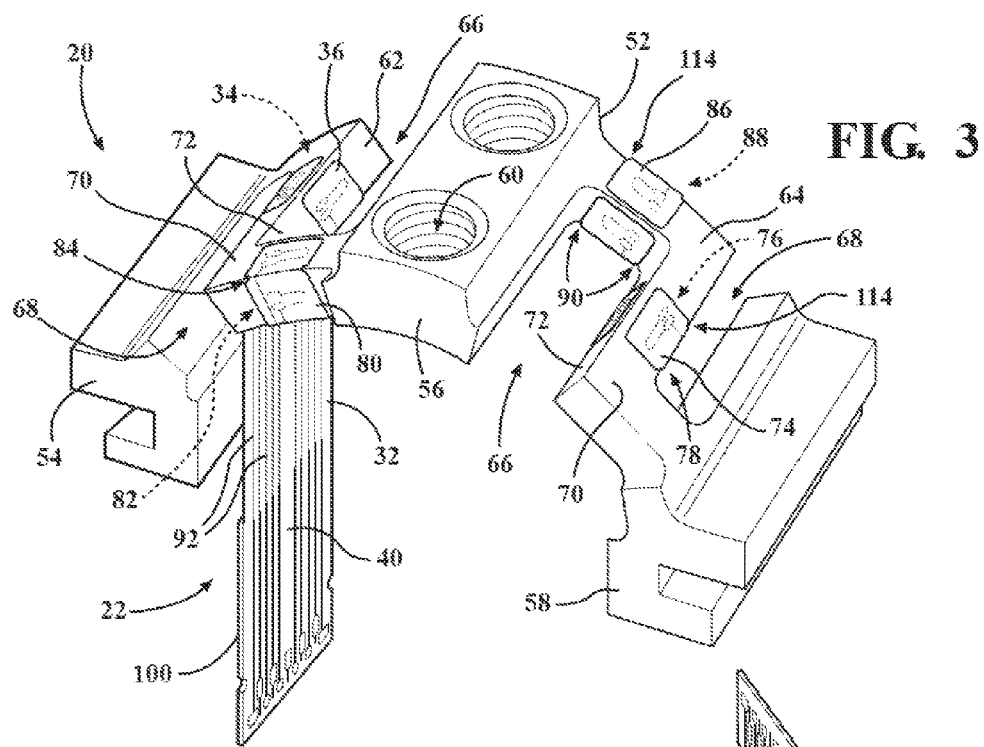
FIG. 3 is a schematic perspective top view of the load cell assembly.
Figure 4:
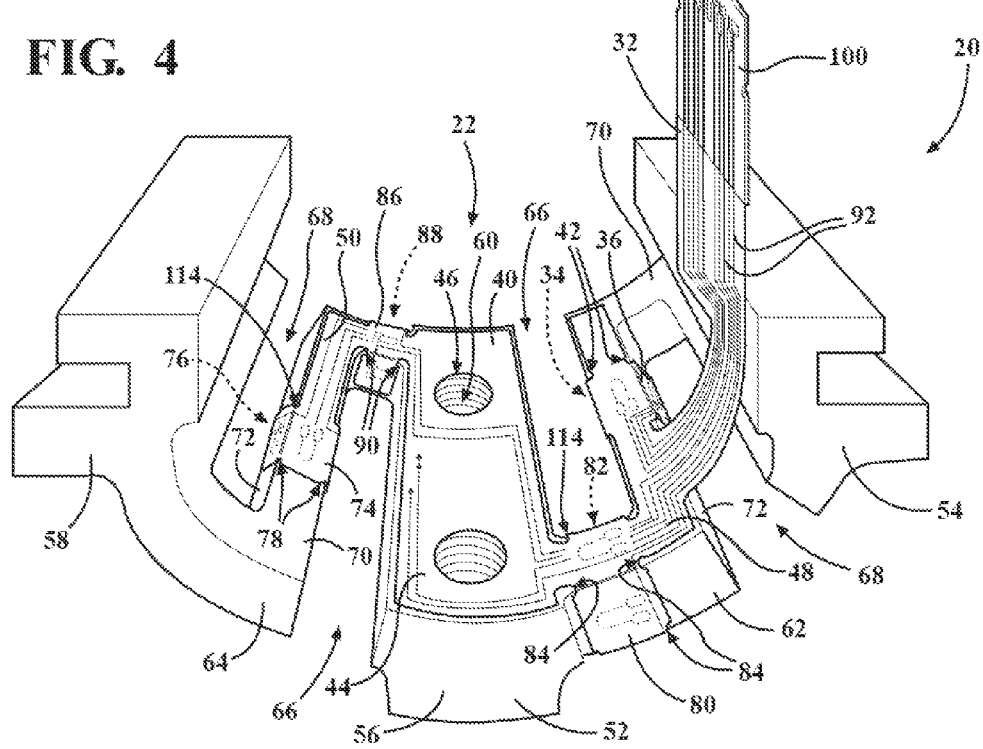
FIG. 4 is a schematic perspective bottom view of the load cell assembly.

Turning to FIGS. 3 and 4, the load cell assembly 20 includes a flexible circuit body 32 and a plurality of strain gauges 34 attached or mounted to the flexible circuit body 32 to define the circuit device 22. In certain embodiments, the flexible circuit body 32 includes a strip 36 with the strain gauges 34 attached or mounted to the strip 36.

Figure 5:
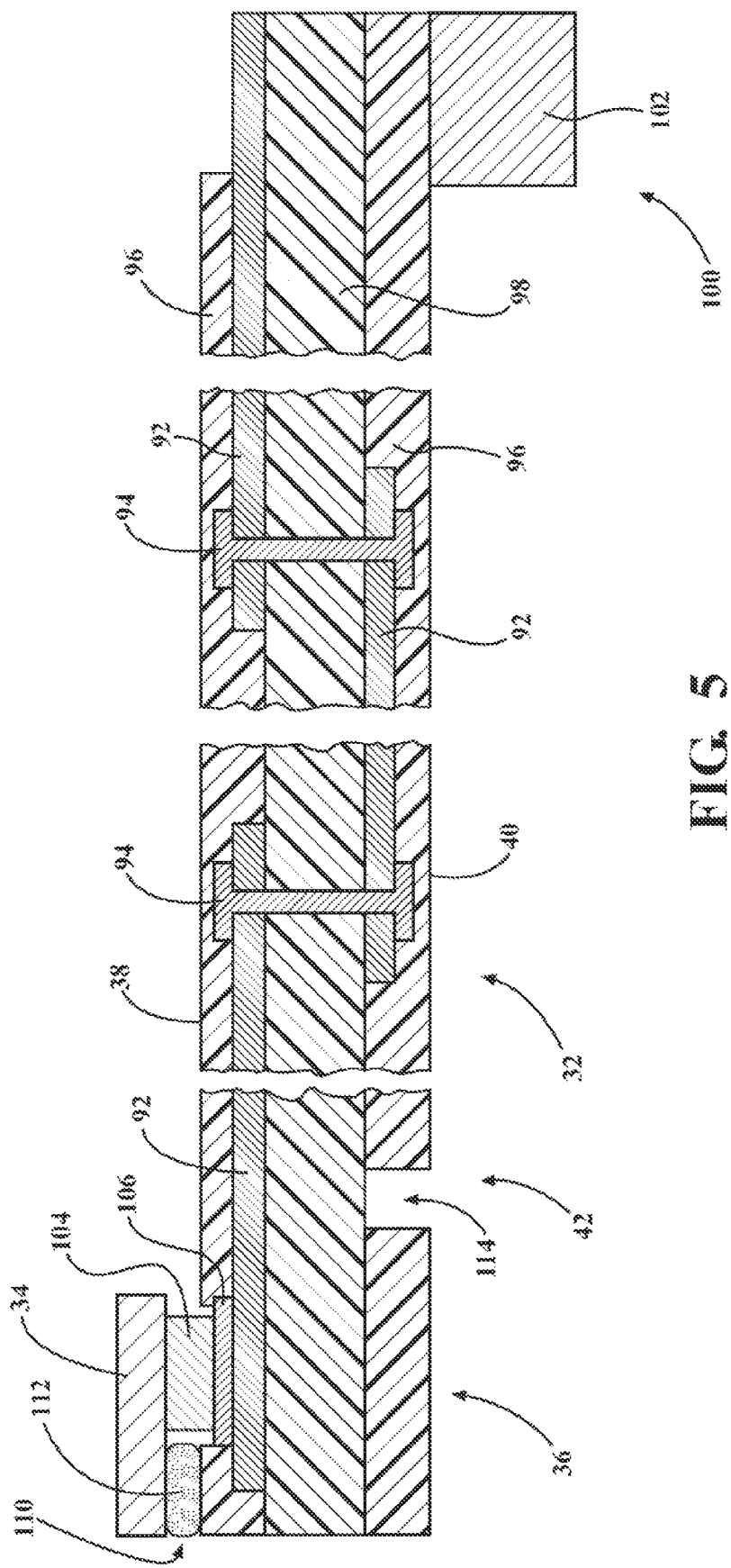
FIG. 5 is a schematic cross-sectional view of a strain gauge and a flexible circuit body.
Figure 6:
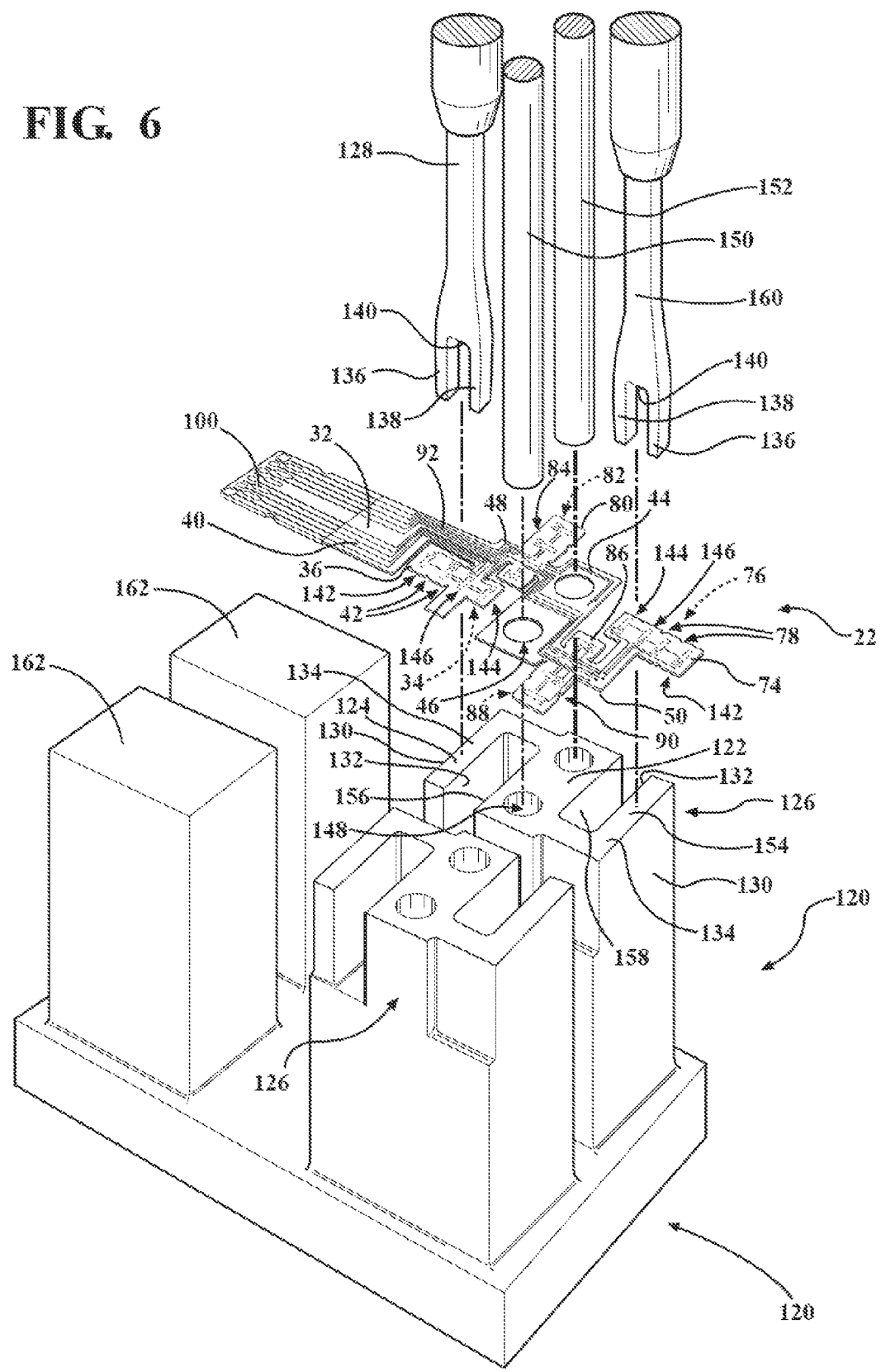
FIG. 6 is a schematic exploded perspective view of a first jig, a first fork, a second fork, a first rod and a second rod, and a circuit device including a first strip, a second strip, a third strip and a fourth strip being in a first position or unfolded position.
Figure 7:
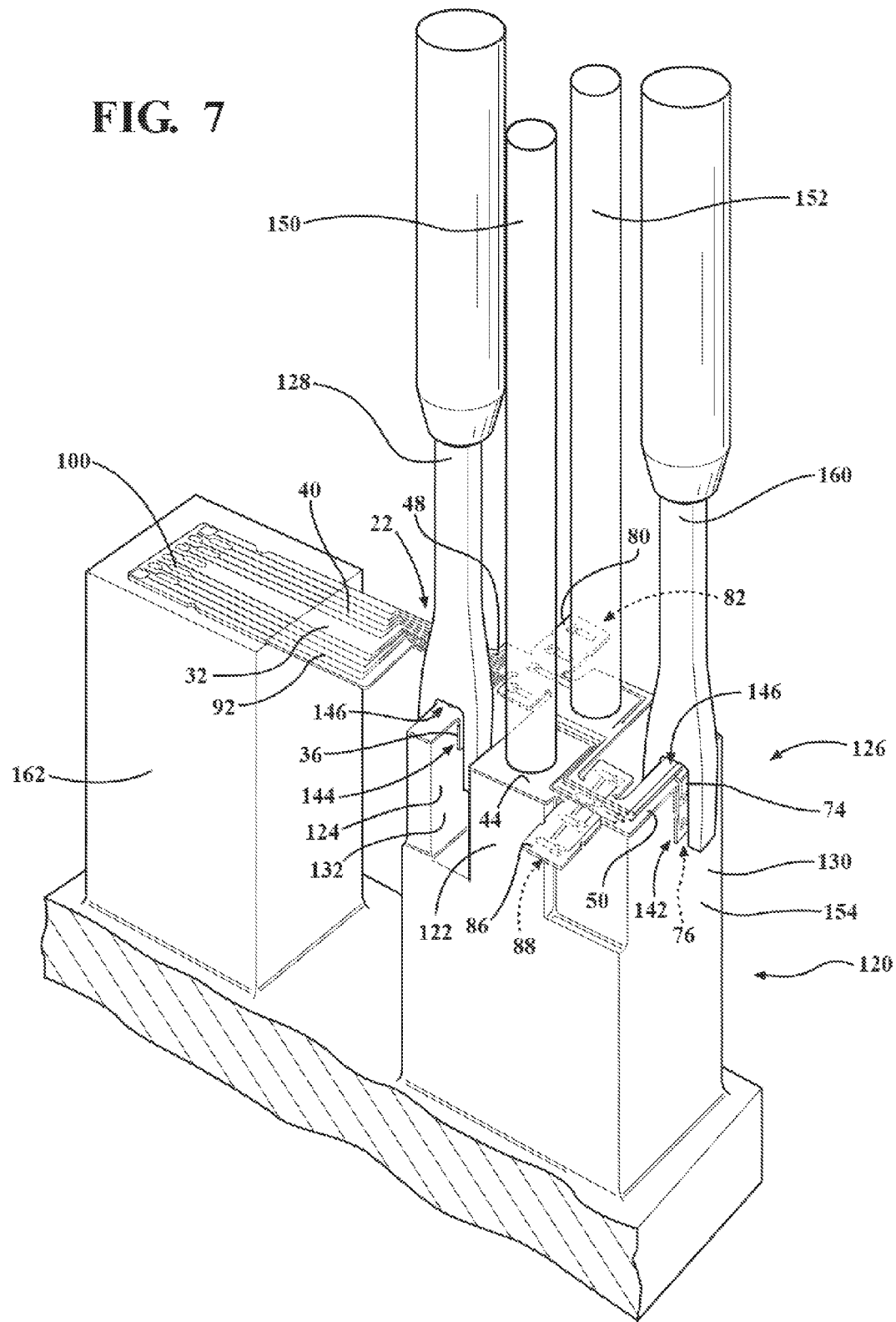
FIG. 7 is a schematic perspective view of the first jig and the circuit device with the first and second strips in a second position or first folded position.
Figure 8:
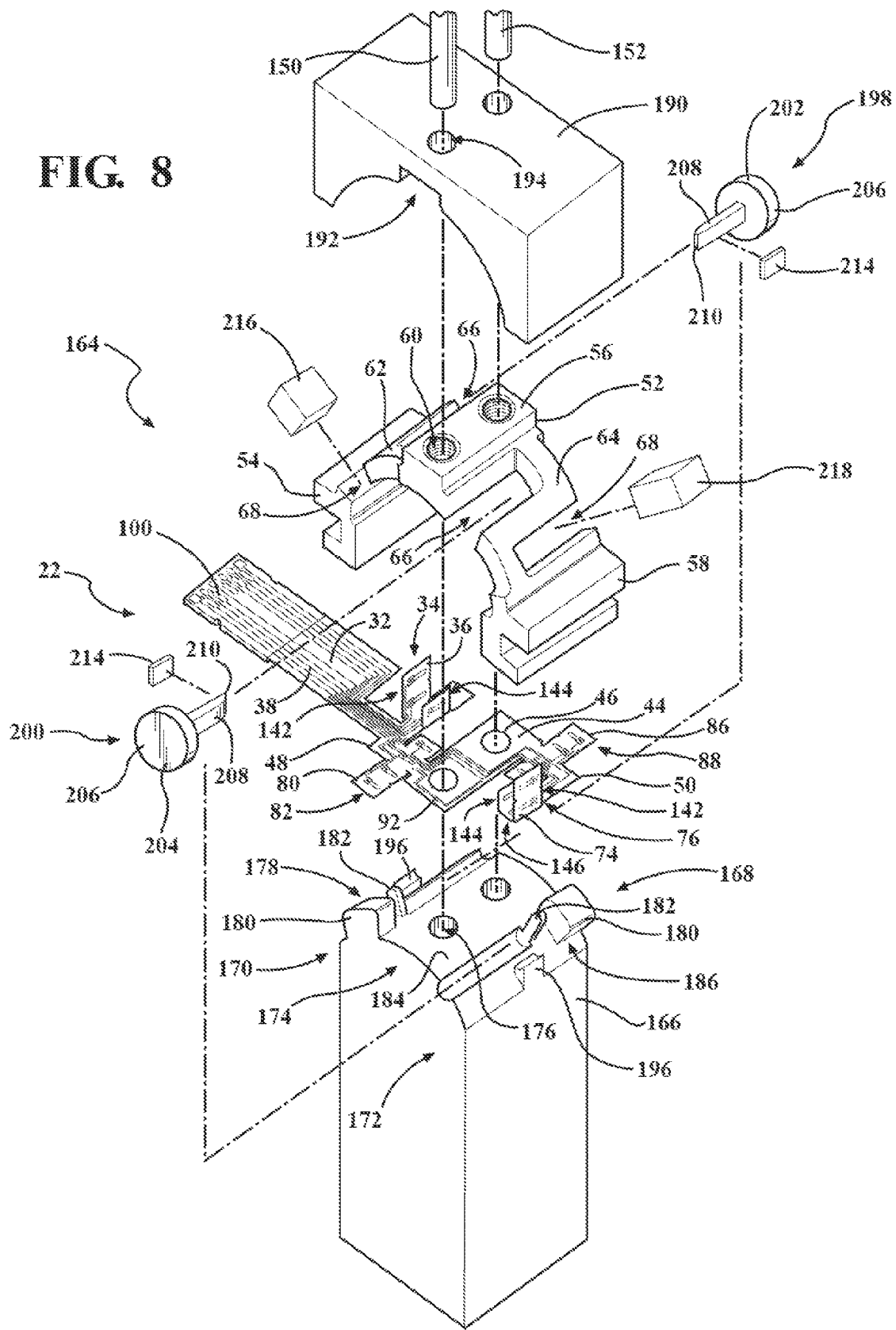
FIG. 8 is a schematic exploded perspective view of a second jig, the circuit device, a support and the first and second rods, with the first and second strips in the second position and with the third and fourth strips in the first position.
Figure 9:
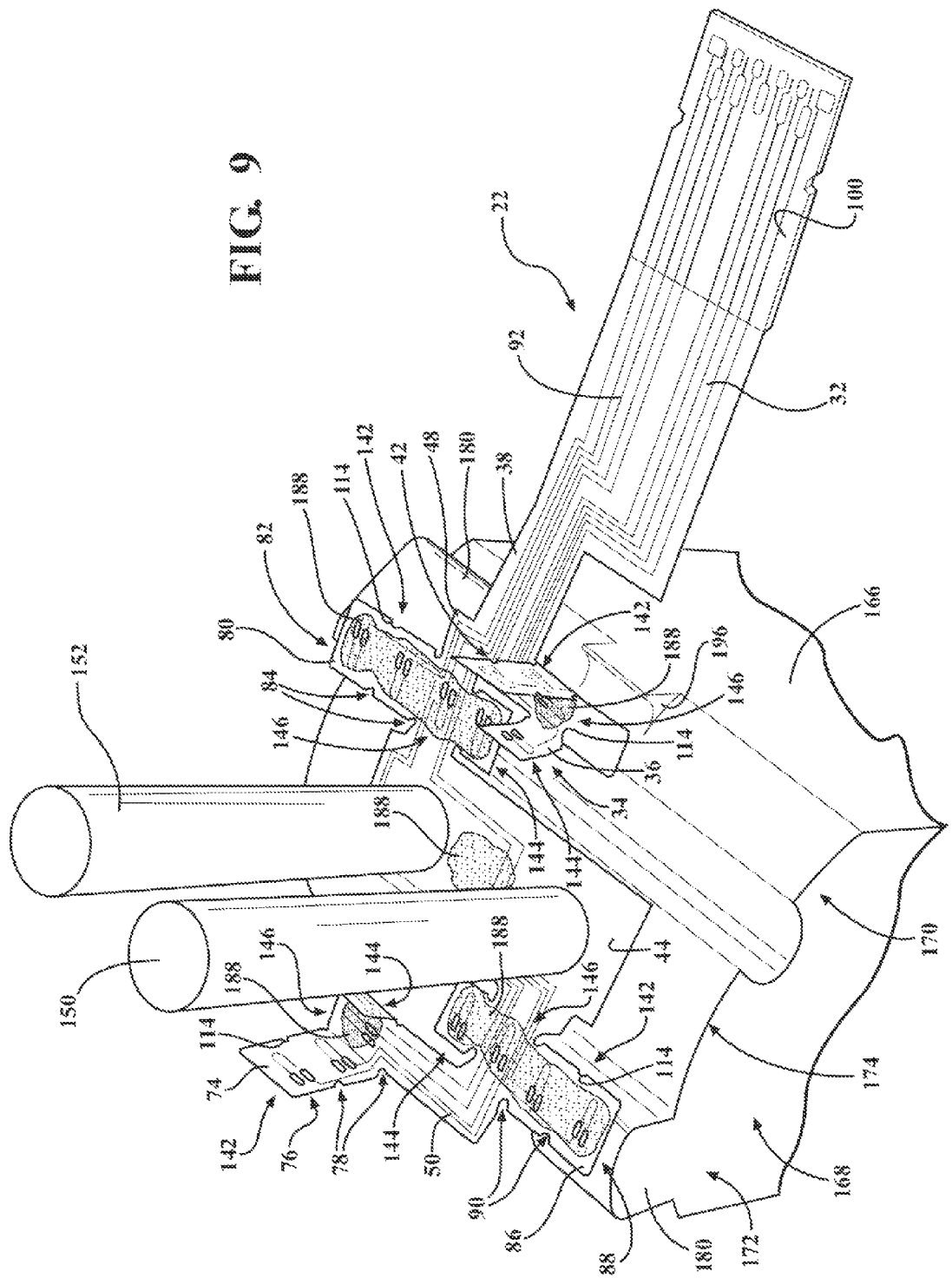
FIG. 9 is a schematic perspective view of the circuit device attached to the second jig and adhesive disposed on the first, second, third and fourth strips.

Also turning to FIG. 5, generally, the flexible circuit body 32 includes a top side 38 and a bottom side 40 opposing the top side 38. Furthermore, FIGS. 6 and 7 illustrate the flexible circuit body 32 with the bottom side 40 up and FIGS. 8 and 9 illustrate the flexible circuit body 32 with the top side 38 up. The strain gauges 34 are attached to the flexible circuit body 32, and more specifically the strip 36, when the flexible circuit body 32 is substantially flat. In certain embodiments, the strain gauges 34 are attached to the top side 38 of the flexible circuit body 32. Attaching the strain gauges 34 to the flexible circuit body 32 while being substantially flat increases the accuracy of the placement of the strain gauges 34 on the flexible circuit body 32.

As best shown in FIGS. 5 and 6, the strip 36 can have a hinge 42, and more specifically, in certain embodiments, the strip 36 can have a plurality of hinges 42. In one embodiment, the hinge 42 is disposed between a pair of the strain gauges 34. In another embodiment, one of the hinges 42 is disposed between each of the strain gauges 34. Therefore, generally, the strain gauges 34 are spaced from each other and the hinges 42 are spaced from each other. The hinges 42 assist in providing folding or bending of the strip 36 between the strain gauges 34 as discussed further below. It is to be appreciated that any suitable number of strain gauges 34 and hinges 42 can be utilized.

Referring to FIGS. 4 and 6, the flexible circuit body 32 can further include a middle portion 44 defining an aperture 46 and more specifically, defining a plurality of apertures 46. Generally, the apertures 46 are spaced from each other. It is to be appreciated that any suitable number of apertures 46 can be utilized. The apertures 46 will be discussed further below with regard to the methods 1000, 2000, 3000.

The flexible circuit body 32 can also include a first branch 48 extending from the middle portion 44. In certain embodiments, the flexible circuit body 32 can include a second branch 50 extending from the middle portion 44 away from the first branch 48. Generally, the strip 36 extends from one of the first and second branches 48, 50 (see FIG. 6). In one embodiment, the strip 36 extends from the first branch 48 as shown in FIGS. 4 and 6. It is to be appreciated that the strip 36 can overlap the branch 48, 50 that the strip 36 extends from. Therefore, as best shown in FIG. 6, when the strip 36 extends from the first branch 48, at least one of the strain gauges 34 of the strip 36 is disposed along the first branch 48.

Turning to FIGS. 2-4, the load cell assembly 20 further includes a support 52 with the flexible circuit body 32 coupled to the support 52. More specifically, the flexible circuit body 32 is attached or secured to the support 52 to define a modular unit. Therefore, the load cell assembly 20 is a modular unit. The load cell assembly 20 as the modular unit is then attached to the robotic member 24, such as the phalange 30, thus providing an efficient way to attach the strain gauges 34 to the robotic member 24. Furthermore, the load cell assembly 20 provides replaceability of the unit. For example, when it is desirable to replace the modular unit, the modular unit can be detached from the robotic member 24 and replaced with another modular unit. In addition, the modular unit is compact which allows the modular unit to be attached or mounted to small members, such as fingers 28, phalanges 30, etc.

The support 52 includes a first portion 54 and a second portion 56, and in certain embodiments, the support 52 includes a third portion 58. Generally, the first, second and third portions 54, 56, 58 are spaced from each other. In certain embodiments, the second portion 56 is disposed between the first and third portions 54, 58, with at least one of the first and third portions 54, 58 attached to the phalange 30. In one embodiment, as shown in FIG. 2, the first and third portions 54, 58 are both attached to the phalange 30.

Referring to FIGS. 2-4, in certain embodiments, the flexible circuit body 32 is attached to at least one of the first, second, and third portions 54, 56, 58 to secure the flexible circuit body 32 to the support 52. Generally, the middle portion 44 of the flexible circuit body 32 and the second portion 56 of the support 52 align with each other and are complementary to each other. In one embodiment, the flexible circuit body 32, and more specifically the middle portion 44 is attached to the second portion 56 of the support 52.

The support 52 can also define an opening 60 and more specifically, a plurality of openings 60. Generally, the openings 60 are spaced from each other. In certain embodiments, the second portion 56 defines the openings 60. Specifically, the openings 60 of the second portion 56 cooperate with the apertures 46 of the flexible circuit body 32, i.e., the openings 60 align with the apertures 46. It is to be appreciated that any suitable number of openings 60 can be utilized. The openings 60 will be discussed further below with regard to the methods 1000, 2000, 3000.

Turning to FIGS. 2-4, the support 52 can further include a first bridge 62 disposed between the first and second portions 54, 56. More specifically, the first bridge 62 is attached to the first and second portions 54, 56 for joining together the first and second portions 54, 56. Generally, the first branch 48 of the flexible circuit body 32 and the first bridge 62 align with each other and are complementary to each other.

In addition, the support 52 can include a second bridge 64 disposed between the second and third portions 56, 58. More specifically, the second bridge 64 is attached to the second and third portions 56, 58 for joining together the second and third portions 56, 58. In certain embodiments, the first and second bridges 62, 64 are spaced from each other. Generally, the second branch 50 of the flexible circuit body 32 and the second bridge 64 align with each other and are complementary to each other.

In certain embodiments, the first, second, and third portions 54, 56, 58, as well as the first and second bridges 62, 64 cooperate with each other such that the support 52 defines a 3-dimensional configuration. For example, the support 52 can define an arcuate configuration. It is to be appreciated that the support 52 can define a linear configuration or any other suitable configuration.

In certain embodiments, the support 52 is formed of metal. In one embodiment, the metal is an alloy. One suitable alloy is an aluminum alloy. It is to be appreciated that the support 52 can be formed of any suitable metal or material. Furthermore, it is to be appreciated that the first and second bridges 62, 64 can be integrally formed to the first, second and third portions 54, 56, 58 to define a unitary support. It is to also be appreciated that the first bridge 62 can be attached to the first and second portions 54, 56 by welding or any other suitable methods, and the second bridge 64 can be attached to the second and third portions 56, 58 by welding or any other suitable methods.

Before the flexible circuit body 32, and more specifically the circuit device 22, is attached to the support 52, the support 52 can be treated. For example, to prepare the support 52 for attaching the circuit device 22 thereon, a neutralizer can be applied to the support 52 and allowed to dry. In certain embodiments, an inert gas can be applied to dry the neutralizer. One suitable inert gas is nitrogen. Once the neutralizer dries, an activator can be applied to the support 52 and allowed to dry. Once the activator dries, the support 52 is ready to have the circuit device 22 attached thereon. As another example, to prepare the support 52 for attaching the circuit device 22 thereon, the support 52 can be micro bead blasted to improve adhesion, and anodized to a clear coat to electrically insulate the support 52.

The first and second bridges 62, 64 can each define a first slot 66 and a second slot 68. In certain embodiments, the first and second slots 66, 68 of the first bridge 62 are spaced from each other. Similarly, the first and second slots 66, 68 of the second bridge 64 are spaced from each other. The first slot 66 of the first bridge 62 is disposed adjacent to the second portion 56 of the support 52 and the second slot 68 of the first bridge 62 is disposed adjacent to the first portion 54 of the support 52. In addition, the first slot 66 of the second bridge 64 is disposed adjacent to the second portion 56 of the support 52 and the second slot 68 of the second bridge 64 is disposed adjacent to the third portion 58 of the support 52.

The first branch 48 aligns with the first bridge 62 adjacent to the first and second slots 66, 68 of the first bridge 62. Similarly, the second branch 50 aligns with the second bridge 64 adjacent to the first and second slots 66, 68 of the second bridge 64. In other words, the first and second branches 48, 50 of the flexible circuit body 32 are not visible through the first and second slots 66, 68 of the first and second bridges 62, 64 respectively. Therefore, when the load cell assembly 20/modular unit is attached to the phalange 30, the first and second branches 48, 50 are not visible in the first and second slots 66, 68 of the first and second bridges 62, 64, respectively.

In certain embodiments, the flexible circuit body 32 is attached or secured to at least one of the first and second bridges 62, 64. In one embodiment, the flexible circuit body 32 is attached to both of the first and second bridges 62, 64. More specifically, the flexible circuit body 32 is attached to one of the first and second bridges 62, 64 by the strip 36. Therefore, for example, when the strip 36 is folded or bent along the hinges 42, the strip 36 is wrapped about or around one of the first and second bridges 62, 64 such that the strain gauges 34 surround the respective bridge 62, 64.

The strip 36 is further defined as a first strip 36 and will be referred to as the first strip 36 below. In addition, the strain gauges 34 are further defined as a plurality of first strain gauges 34 and will be referred to as the first strain gauges 34 below. Furthermore, the hinge 42 is further defined as a first hinge 42 and will be referred to as the first hinge 42 or the first hinges 42 below. In one embodiment, the first strip 36 is wrapped around or about the first bridge 62 to secure together the flexible circuit body 32 and the support 52. In other words, the first strip 36 attaches the flexible circuit body 32 and the support 52 together such that the first strain gauges 34 surround the first bridge 62. As such, the first strip 36 is wrapped around the first bridge 62 to align the first strain gauges 34 around the first bridge 62.

Turning to FIGS. 3, 4 and 6, the first strain gauges 34 can be further defined as a first pair of strain gauges and a second pair of strain gauges. Hence, the first and second pair of strain gauges are attached to the first strip 36. The first pair of strain gauges oppose each other on opposite first sides 70 of the first bridge 62 and the second pair of strain gauges oppose each other on opposite second sides 72 of the first bridge 62 when the first strip 36 is wrapped around the first bridge 62. Therefore, the first and second pairs of strain gauges cooperate to surround the sides 70, 72 of the first bridge 62 to measure the load or strain applied to the support 52. More specifically, the first and second pairs of strain gauges cooperate to surround the sides 70, 72 of the first bridge 62 to measure the load or strain applied to the first bridge 62.

In certain embodiments, the flexible circuit body 32 can further include a second strip 74 and a plurality of second strain gauges 76 attached or mounted to the second strip 74. Generally, the second strip 74 can extend from one of the first and second branches 48, 50. In one embodiment, the second strip 74 extends from the second branch 50 as best shown in FIG. 6. As such, the second strip 74 is spaced from the first strip 36. It is to be appreciated that the second strip 74 can overlap the branch 48, 50 that the second strip 74 extends from. Therefore, as shown in FIG. 6, when the second strip 74 extends from the second branch 50, at least one of the second strain gauges 76 of the second strip 74 is disposed along the second branch 50.

Continuing with FIG. 6, the second strip 74 can have a second hinge 78, and more specifically, in certain embodiments, the second strip 74 can have a plurality of second hinges 78. In one embodiment, the second hinge 78 is disposed between a pair of the second strain gauges 76. In another embodiment, one of the second hinges 78 is disposed between each of the second strain gauges 76. Therefore, generally, the second strain gauges 76 are spaced from each other and the second hinges 78 are spaced from each other. The second hinges 78 assist in providing folding or bending of the second strip 74 between the second strain gauges 76. As such, for example, when the second strip 74 is folded or bent along the second hinges 78, the second strip 74 is wrapped about or around one of the first and second bridges 62, 64 such that the second strain gauges 76 surround the respective bridge 62, 64. Specifically, in one embodiment, the first strip 36 is wrapped around the first bridge 62 and the second strip 74 is wrapped around the second bridge 64 as best shown in FIGS. 2-4. Simply stated, the first and second strips 36, 74 attach the flexible circuit body 32 to the support 52.

As mentioned above, the second strip 74 is wrapped around the second bridge 64 to secure together the flexible circuit body 32 and the support 52. In other words, the second strip 74 attaches the flexible circuit body 32 and the support 52 together such that the second strain gauges 76 surround the second bridge 64. Furthermore, the second strip 74 is wrapped around the second bridge 64 to align the second strain gauges 76 around the second bridge 64.

Turning to FIGS. 3, 4 and 6, the second strain gauges 76 can be further defined as a third pair of strain gauges and a fourth pair of strain gauges. Hence, the third pair of strain gauges oppose each other on opposite first sides 70 of the second bridge 64 and the fourth pair of strain gauges oppose each other on opposite second sides 72 of the second bridge 64 when the second strip 74 is wrapped around the second bridge 64. Therefore, the third and fourth pairs of strain gauges cooperate to surround the sides 70, 72 of the second bridge 64 to measure the load or strain applied to the support 52. More specifically, the third and fourth pairs of strain gauges cooperate to surround the sides 70, 72 of the second bridge 64 to measure the load or strain applied to the second bridge 64.

In certain embodiments, the flexible circuit body 32 can also include a third strip 80 and a plurality of third strain gauges 82 attached or mounted to the third strip 80. Generally, the third strip 80 can extend from one of the first and second branches 48, 50. In one embodiment, the third strip 80 extends from the first branch 48 as best shown in FIG. 6. As such, the third strip 80 is spaced from the first and second strips 36, 74. It is to be appreciated that the third strip 80 can overlap the branch 48, 50 that the third strip 80 extends from. Therefore, as shown in FIG. 6, when the third strip 80 extends from the first branch 48, at least one of the third strain gauges 82 of the third strip 80 is disposed along the first branch 48.

Continuing with FIG. 6, the third strip 80 can have a third hinge 84, and more specifically, in certain embodiments, the third strip 80 can have a plurality of third hinges 84. In one embodiment, the third hinge 84 is disposed between a pair of the third strain gauges 82. In another embodiment, one of the third hinges 84 is disposed between each of the third strain gauges 82. Therefore, generally, the third strain gauges 82 are spaced from each other and the third hinges 84 are spaced from each other. The third hinges 84 assist in providing folding or bending of the third strip 80 between the third strain gauges 82. As such, for example, when the third strip 80 is folded or bent along the third hinges 84, the third strip 80 is wrapped about one of the first and second bridges 62, 64 such that the third strain gauges 82 surround the respective bridge 62, 64. Specifically, in one embodiment, the first and third strips 36, 80 are wrapped around the first bridge 62 and the second strip 74 is wrapped around the second bridge 64 as best shown in FIGS. 2-4. Simply stated, the first, second and third strips 36, 74, 80 attach the flexible circuit body 32 to the support 52.

As mentioned above, the third strip 80 is wrapped around the first bridge 62 to secure together the flexible circuit body 32 and the support 52. In other words, the third strip 80 attaches the flexible circuit body 32 and the support 52 together such that the third strain gauges 82 surround the first bridge 62. Furthermore, the third strip 80 is wrapped around the first bridge 62 to align the third strain gauges 82 around the first bridge 62.

Turning to FIGS. 3, 4 and 6, the third strain gauges 82 can be further defined as a fifth pair of strain gauges and a sixth pair of strain gauges. Hence, the fifth pair of strain gauges oppose each other on the opposite first sides 70 of the first bridge 62 and the sixth pair of strain gauges oppose each other on the opposite second sides 72 of the first bridge 62 when the third strip 80 is wrapped around the first bridge 62. Therefore, the fifth and sixth pairs of strain gauges cooperate to surround the sides 70, 72 of the first bridge 62 to measure the load or strain applied to the support 52. More specifically, the fifth and sixth pairs of strain gauges cooperate to surround the sides 70, 72 of the first bridge 62 to measure the load or strain applied to the first bridge 62.

In certain embodiments, the flexible circuit body 32 can also include a fourth strip 86 and a plurality of fourth strain gauges 88 attached or mounted to the fourth strip 86. Generally, the fourth strip 86 can extend from one of the first and second branches 48, 50. In one embodiment, the fourth strip 86 extends from the second branch 50 as best shown in FIG. 6. As such, the fourth strip 86 is spaced from the first, second and third strips 36, 74, 80. It is to be appreciated that the fourth strip 86 can overlap the branch 48, 50 that the fourth strip 86 extends from. Therefore, as shown in FIG. 6, when the fourth strip 86 extends from the second branch 50, at least one of the fourth strain gauges 88 of the fourth strip 86 is disposed along the second branch 50.

Continuing with FIG. 6, the fourth strip 86 can have a fourth hinge 90, and more specifically, in certain embodiments, the fourth strip 86 can have a plurality of fourth hinges 90. In one embodiment, the fourth hinge 90 is disposed between a pair of the fourth strain gauges 88. In another embodiment, one of the fourth hinges 90 is disposed between each of the fourth strain gauges 88. Therefore, generally, the fourth strain gauges 88 are spaced from each other and the fourth hinges 90 are spaced from each other. The fourth hinges 90 assist in providing folding or bending of the fourth strip 86 between the fourth strain gauges 88. Therefore, for example, when the fourth strip 86 is folded or bent along the fourth hinges 90, the fourth strip 86 is wrapped about one of the first and second bridges 62, 64 such that the fourth strain gauges 88 surround the respective bridge 62, 64. Specifically, in one embodiment, the first and third strips 36, 80 are wrapped around the first bridge 62 and the second and fourth strips 74, 86 are wrapped around the second bridge 64 as shown in FIGS. 2-4. Simply stated, the first, second, third and fourth strips 36, 74, 80, 86 attach the flexible circuit body 32 to the support 52.

As mentioned above, the fourth strip 86 is wrapped around the second bridge 64 to secure together the flexible circuit body 32 and the support 52. In other words, the fourth strip 86 attaches the flexible circuit body 32 and the support 52 together such that the fourth strain gauges 88 surround the second bridge 64. Furthermore, the fourth strip 86 is wrapped around the second bridge 64 to align the fourth strain gauges 88 around the second bridge 64.

Turning to FIGS. 3, 4 and 6, the fourth strain gauges 88 can be further defined as a seventh pair of strain gauges and an eighth pair of strain gauges. Hence, the seventh pair of strain gauges oppose each other on the opposite first sides 70 of the second bridge 64 and the eighth pair of strain gauges oppose each other on the opposite second sides 72 of the second bridge 64 when the fourth strip 86 is wrapped around the second bridge 64. Therefore, the seventh and eighth pairs of strain gauges cooperate to surround the sides 70, 72 of the second bridge 64 to measure the load or strain applied to the support 52. More specifically, the seventh and eighth pairs of strain gauges cooperate to surround the sides 70, 72 of the second bridge 64 to measure the load or strain applied to the second bridge 64.

The first, second, third, fourth, fifth, sixth, seventh and eighth pairs of strain gauges cooperate to measure the load or strain in six-degrees of freedom. Specifically, the load is measured in three linear directions and three rotational directions. Furthermore, the load can be measured in the three linear directions and the three rotational directions simultaneously. In addition, utilizing pairs of strain gauges allows the strain gauges 34, 76, 82, 88 to capture bending moments. It is to be appreciated that the first, second, third and fourth strips 36, 74, 80, 86, as well as the first, second, third, fourth, fifth, sixth, seventh and eighth pairs of strain gauges further define the circuit device 22. It is to also be appreciated that the strain gauges 34, 76, 82, 88 can be calibrated if desired. It is to further be appreciated that the strain gauges 34, 76, 82, 88 are attached to the flexible circuit body 32 while the respective first, second, third and fourth strips 36, 74, 80, 86 are substantially flat which increases the accuracy of the placement of the strain gauges 34, 76, 82, 88 on the flexible circuit body 32.

In certain embodiments, the first, second, third and fourth strain gauges 34, 76, 82, 88 are silicon strain gauges. More specifically, the first, second, third, fourth, fifth, sixth, seventh and eighth pairs of strain gauges are silicon strain gauges. It is to be appreciated that any suitable strain gauges can be utilized to measure the load or strain applied to the support 52, and more specifically, the first and second bridges 62, 64. For example, other suitable strain gauges are semiconductor strain gauges or foil strain gauges. It is to be appreciated that silicon strain gauges generally have a higher sensitivity to loads than foil strain gauges.

As best shown in FIGS. 5 and 6, the flexible circuit body 32 can include wires 92 or traces extending through the flexible circuit body 32. The wires 92 are attached to first, second, third and fourth strain gauges 34, 76, 82, 88 for receiving data or information from these strain gauges 34, 76, 82, 88. More specifically, the first, second, third, fourth, fifth, sixth, seventh and eighth pairs of strain gauges are attached to the wires 92 which extend through the flexible circuit body 32 for receiving data from each of the pairs of strain gauges. Providing the flexible circuit body 32 with integrated wires 92 and the first, second, third and fourth strain gauges 34, 76, 82, 88 attached to respective first, second, third and fourth strips 36, 74, 80, 86 eliminates having free-standing wires leading to each of the first, second, third, fourth, fifth, sixth, seventh and eighth pairs of strain gauges. The strain gauges 34, 76, 82, 88 can be attached to the wires 92 by adhering as discussed below, soldering or any other suitable method. It is to be appreciated that various wires 92 to the first, second, third, fourth, fifth, sixth, seventh and eighth pairs of strain gauges have been eliminated in the Figures for illustrative purposes only.

The wires 92 can be formed of a conductive material. In one embodiment, the wires 92 are formed of copper. It is to be appreciated that the wires 92 can be formed of any suitable conductive materials. It is to also be appreciated that the wires 92 can be disposed in different layers in the flexible circuit body 32 (see FIG. 5) such that the wires 92 can be routed around other wires 92, etc. The wires 92 can be re-routed utilizing connectors 94, such as vias 94. Vias 94 can be formed of a conductive material, such as for example, gold or any other suitable conductive materials.

Continuing with FIG. 5, the flexible circuit body 32 is generally formed of a first substrate 96 and a second substrate 98. Therefore, the first and second substrates 96, 98 generally surround the wires 92 and the vias 94. In other words, the wires 92 and the vias 94 are generally embedded between the first and second substrates 96, 98. The first and second substrates 96, 98 minimize electrical short-outs as known to those skilled in the art. Furthermore, the first substrate 96 allows the flexible circuit body 32 to be flexible to allow bending or contouring of the flexible circuit body 32 to the support 52. It is to be appreciated that the wires 92 are shown in solid lines in various Figures for illustrative purposes only and as indicated above, the wires 92 are generally surrounded or embedded between the first and second substrates 96, 98 as shown in FIG. 5.

In certain embodiments, the first and second substrates 96, 98 are each formed of a non-conductive material, such as a polymeric material. In one embodiment, the polymeric material of the first and second substrates 96, 98 is a polyimide. It is to be appreciated that any suitable non-conductive or dielectric materials can be utilized for the first and second substrates 96, 98. Furthermore, it is to be appreciated that the first and second substrates 96, 98 can be formed of the same non-conductive material or different non-conductive materials.

In addition, the flexible circuit body 32 can include a connector 100 coupled to the wires 92 and extending from one of the first and second branches 48, 50 for communicating data or information from the wires 92 and the first, second, third and fourth strain gauges 34, 76, 82, 88 to a controller as known to those skilled in the art. In other words, measurements regarding loads or strains are communicated from the first, second, third, fourth, fifth, sixth, seventh and eighth pairs of strain gauges through the wires 92 and out the connector 100 to the controller.

It is to be appreciated that the connector 100 can include a third substrate 102 for stiffening the connector 100. In certain embodiments, the third substrate 102 is formed of a non-conductive material, such as a polymeric material. In one embodiment, the polymeric material of the third substrate 102 is a polyimide. It is to be appreciated that any suitable non-conductive or dielectric materials can be utilized for the third substrate 102. Furthermore, it is to be appreciated that the first, second and third substrates 96, 98, 102 can be formed of the same non-conductive material or different non-conductive materials.

As discussed above, the load or strain applied to the robotic member 24 while grasping the object can be measured by the strain gauges 34, 76, 82, 88. Therefore, when performing the task such as grasping the object, the load is applied to the support 52 which causes the support 52 to flex or bend. In other words, the support 52 is distorted while performing the task; therefore, the strain gauges 34, 76, 82, 88 measure the flexing, bending or distortion of the support 52. The measurements from the strain gauges 34, 76, 82, 88 are converted into an electric signal which is relayed through the connector 100 out to the controller. The signals from the strain gauges 34, 76, 82, 88 can be used to interpret information such as direction and amount of force acting on that particular phalange 30 or finger 28, whether there is slippage and whether that particular phalange 30 or finger 28 is grasping or pointing. Furthermore, as discussed above, utilizing pairs of strain gauges allows the strain gauges 34, 76, 82, 88 to capture bending moments. Therefore, the load cell assembly 20 provides both directional and orientation data or information regarding the phalange 30 or finger 28. It is to be appreciated that the electric signal can be amplified by any suitable device, circuit, etc.

As also discussed above, the first, second, third and fourth strain gauges 34, 76, 82, 88 are attached to the flexible circuit body 32. More specifically, the first, second, third and fourth strain gauges 34, 76, 82, 88 are attached to the top side 38 of the flexible circuit body 32. Generally, the strain gauges 34, 76, 82, 88 are attached to the flexible circuit body 32 before being attached to the support 52. Specifically, a contact 104 (see FIG. 5) is disposed between each of the strain gauges 34, 76, 82, 88 and each of the respective wires 92 to electrically connect the strain gauges 34, 76, 82, 88 to the wires 92. The contacts 104 can be formed of a conductive material. In certain embodiments, the conductive material of the contact 104 is gold. It is to be appreciated that any suitable conductive materials can be utilized for the contact 104. It is to also be appreciated that a silicon layer can be disposed between each of the strain gauges 34, 76, 82, 88 and the respective contact 104.

The contacts 104 can further include an adhesive layer formed of a conductive material. The conductive adhesive layer can be a conductive epoxy. One suitable conductive epoxy is silver epoxy. It is to be appreciated that any suitable conductive adhesive layer can be utilized.

In certain embodiments, a pad 106 (see FIG. 5) is disposed between each of the contacts 104 and respective wires 92 to electrically connect the strain gauges 34, 76, 82, 88 to the wires 92. Therefore, the pad 106 is sandwiched between respective contacts 104 and respective wires 92. The pads 106 can be formed of a conductive material. In certain embodiments, the conductive material of the pad 106 is gold. It is to be appreciated that any suitable conductive materials can be utilized for the pad 106.

Initially, the circuit device 22 can be heated in a heater 108 (see FIG. 14) to cure the conductive adhesive layer and adhere the strain gauges 34, 76, 82, 88 to the respective pads 106 of the flexible circuit body 32. It is to be appreciated that the heater 108 can be an oven, a hot plate, a vacuum oven, or any other suitable heater. It is to further be appreciated that the circuit device 22 can be heated to any suitable temperature for any suitable amount of time to cure the conductive adhesive layer.

After heating the circuit device 22 to cure the conductive adhesive layer, the circuit device 22 is cooled. Generally, the circuit device 22 is cooled until the circuit device 22 is cool to touch. It is to be appreciated that the circuit device 22 can be cooled at any suitable temperature for any suitable amount of time. It is to also be appreciated that the circuit device 22 can be cooled utilizing a blower, a fan or any other suitable device.

Optionally, the circuit device 22 can again be heated in the heater 108 after cooling the circuit device 22 to further cure the conductive adhesive layer and adhere the strain gauges 34, 76, 82, 88 to the respective pads 106 of the flexible circuit body 32. In certain embodiments, the circuit device 22 is heated in the heater 108 to a temperature from about 140° C. to about 160° C., for about 1 hour to about 5 hours. In one embodiment, the circuit device 22 is heated in the heater 108 to a temperature from about 150° C., for about 4 hours. As discussed above, the heater 108 can be the oven, the hot plate, the vacuum oven, or any other suitable heater. It is to further be appreciated that the circuit device 22 can be heated to any suitable temperature for any suitable amount of time to further cure the conductive adhesive layer.

After re-heating the circuit device 22 to further cure the conductive adhesive layer, the circuit device 22 is again cooled. In certain embodiments, the circuit device 22 is cooled at room temperature, for about 1 hour to about 2 hours. Generally, the circuit device 22 is cooled until the circuit device 22 is cool to touch. In certain embodiments, the circuit device 22 is cooled in ambient air. It is to be appreciated that the circuit device 22 can be cooled at any suitable temperature for any suitable amount of time. As discussed above, it is to also be appreciated that the circuit device 22 can be cooled utilizing the blower, the fan or any other suitable device.

Turning to FIG. 5, the strain gauges 34, 76, 82, 88 and the first substrate 96 define a gap 110 therebetween. In other words, each of the strain gauges 34, 76, 82, 88 are spaced from the first substrate 96. As such, each of the strain gauges 34, 76, 82, 88 are spaced from the top side 38 of the flexible circuit body 32. An adhesive 112 is disposed in the gap 110 to secure the strain gauges 34, 76, 82, 88 to the first substrate 96. More specifically, the adhesive 112 secures the strain gauges 34, 76, 82, 88 to the top side 38 of the flexible circuit body 32. Furthermore, the adhesive 112 supports the strain gauges 34, 76, 82, 88 such that the load or strain applied to the first and second bridges 62, 64 is transferred through the adhesive 112 to the strain gauges 34, 76, 82, 88.

The adhesive 112 can be formed of a non-conductive material. In certain embodiments, the non-conductive material of the adhesive 112 can be a two-component adhesive such as two-component epoxy-phenolic adhesive. One suitable type of adhesive 112 is commercially available under the trade name M-Bond 610 Adhesive from Allied High Tech Products, Inc. of Rancho Dominguez, Calif. It is to be appreciated that any suitable non-conductive adhesive or epoxy can be utilized.

The adhesive 112 can be thinned with a solvent to wick the adhesive 112 under the strain gauges 34, 76, 82, 88 and into the gaps 110. In one embodiment, the solvent can be acetone. The solvent is allowed to evaporate and any residue around the strain gauges 34, 76, 82, 88 after the solvent evaporates is removed. It is to be appreciated that any suitable solvent can be utilized to wick the adhesive 112 under the strain gauges 34, 76, 82, 88. Furthermore, it is to be appreciated that the adhesive 112 can be disposed either partially around the strain gauges 34, 76, 82, 88 or all the way around the strain gauges 34, 76, 82, 88.

After removing the solvent, the circuit device 22 is heated in the heater 108 (see FIG. 14) to cure the adhesive 112. In certain embodiments, the circuit device 22 is heated in the heater 108 to a temperature from about 140° C. to about 160° C., for about 10 minutes to about 20 minutes. In one embodiment, the circuit device 22 is heated in the heater 108 to a temperature from about 150° C., for about 15 minutes. As discussed above, it is to be appreciated that the heater 108 can be the oven, the hot plate, the vacuum oven, or any other suitable heater 108. It is to further be appreciated that the circuit device 22 can be heated to any suitable temperature for any suitable amount of time to cure the adhesive 112.

After heating the circuit device 22 to cure the adhesive 112, the circuit device 22 is cooled. In certain embodiments, the circuit device 22 is cooled at room temperature, for about 5 minutes to about 10 minutes and cooled in ambient air. Generally, the circuit device 22 is cooled until the circuit device 22 is cool to touch. It is to be appreciated that the circuit device 22 can be cooled at any suitable temperature for any suitable amount of time. It is to also be appreciated that the circuit device 22 can be cooled utilizing the blower, the fan or any other suitable device.

Turning back to FIGS. 5 and 6, the first, second, third and fourth hinges 42, 78, 84, 90 can each be further defined as a notch 114. Therefore, the first strip 36 defines the notch 114 between a pair of the first strain gauges 34, the second strip 74 defines the notch 114 between a pair of the second strain gauges 76, the third strip 80 defines the notch 114 between a pair of the third strain gauges 82 and the fourth strip 86 defines the notch 114 between a pair of the fourth strain gauges 88. In certain embodiments, the notch 114 is further defined as a plurality of notches 114 such that one of the notches 114 of the first strip 36 is disposed between each of the first strain gauges 34, one of the notches 114 of the second strip 74 is disposed between each of the second strain gauges 76, one of the notches 114 of the third strip 80 is disposed between each of the third strain gauges 82 and one of the notches 114 of the fourth strip 86 is disposed between each of the fourth strain gauges 88. Furthermore, in certain embodiments, a pair of the notches 114 can be disposed between each of the first, second, third and fourth strain gauges 34, 76, 82, 88 as shown in FIG. 6. It is to be appreciated that the first, second, third and fourth hinges 42, 78, 84, 90 can be defined as a slit, a cut and/or any suitable hinge for assisting in providing folding or bending of the first, second, third and fourth strips 36, 74, 80, 86. It is to further be appreciated that the notch 114 can be utilized with the slit, the cut, etc. to define the first, second, third and fourth hinges 42, 78, 84, 90. It is to also be appreciated that the first, second, third and fourth hinges 42, 78, 84, 90 can be formed of a material configured to fold or bend the first, second, third and fourth strips 36, 74, 80, 86 when heated.

Referring back to FIG. 1, the load cell assembly 20 can further include a cap 116 attached to the support 52. In certain embodiments, the cap 116 is attached to the second portion 56 of the support 52. The cap 116 minimizes direct contact with the strain gauges 34 when the robotic member 24 is performing the task. When utilizing a plurality of load cell assemblies 20, one cap 116 is attached to one support 52 and another cap 116 is attached to another support 52, etc. For illustrative purposes only, FIG. 1 shows the cap 116 in phantom and attached to one support 52 of one load cell assembly 20. It is to be appreciated that, even though not illustrated, each of the load cell assemblies 20 shown in FIG. 1 can have a cap 116. The cap 116 can be attached to the support 52, and more specifically to the second portion 56, by any suitable fasteners 118. For example, screws 118 can be threaded into each of the openings 60 of the second portion 56 of the support 52 to secure the cap 116 to the support 52.

As mentioned above, referring to FIGS. 6, 7 and 15, the present disclosure provides a method 1000 of folding the circuit device 22. The method 1000 includes providing 1002 the flexible circuit body 32 including the strip 36 having the hinge 42 with the strip 36 being in a first position. The strip 36 is further defined as the first strip 36 and the hinge 42 is further defined as the first hinge 42 or first hinges 42. Therefore, for this discussion, the strip 36 is referred to as the first strip 36 and the hinge 42 is referred to as the first hinge 42 or the first hinges 42. Generally, the flexible circuit body 32 is substantially flat when provided. As such, the first strip 36 is unfolded when in the first position. In other words, the first strip 36 is in an unfolded position or the first position when the flexible circuit body 32 is provided.

The method 1000 also includes attaching 1004 the plurality of strain gauges 34 to the first strip 36 to define the circuit device 22, with the first hinge 42 disposed between the pair of strain gauges 34. The strain gauges 34 are further defined as the first strain gauges 34 and will be referred to as the first strain gauges 34 below. Generally, as suggested above, the first strain gauges 34 are attached to the flexible circuit body 32, and more specifically, attached to the first strip 36 to define the circuit device 22. Generally, attaching 1004 the first strain gauges 34 to the first strip 36 are performed with the first strip 36 being in the first position. In other words, the first strain gauges 34 are attached to the flexible circuit body 32 when the flexible circuit body 32 is substantially flat. Therefore, attaching 1004 the strain gauges 34 to the first strip 36 includes attaching the first strain gauges 34 to the first strip 36, with one of the first hinges 42 disposed between each of the first strain gauges 34, and with the first strip 36 being in the first position. The first strain gauges 34 can be attached to the flexible circuit body 32, and more specifically the first strip 36, by adhering as discussed above, soldering or any other suitable method to attach the first strain gauges 34 to the flexible circuit body 32. Specifically, the first strain gauges 34 can be attached to the flexible circuit body 32 utilizing the contact 104, the adhesive 112, etc. as discussed above.

The method 1000 further includes providing 1006 a jig 120 including a mid-portion 122 and a finger 124 extending from the mid-portion 122 to define a pattern 126. The mid-portion 122 is complementary to the middle portion 44 of the flexible circuit body 32 and the finger 124 is complementary to one of the first and second branches 48, 50 of the flexible circuit body 32. The jig 120 is further defined as a first jig 120 and will be referred to as the first jig 120 for this discussion; in addition, the pattern 126 is further defined as a first pattern 126 and will be referred to as the first pattern 126 for this discussion.

In certain embodiments, the first jig 120 is formed of metal. In one embodiment, the first jig 120 is formed of an alloy. One suitable alloy is an aluminum alloy. It is to be appreciated that the first jig 120 can be formed of any suitable metal or material.

The method 1000 also includes abutting 1008 the flexible circuit body 32 to the mid-portion 122 of the first pattern 126, with the first strip 36 remaining in the first position. More specifically, the middle portion 44 of the flexible circuit body 32 abuts the mid-portion 122 and one of the first and second branches 48, 50 abuts the finger 124. In one embodiment, the first branch 48 abuts the finger 124. As discussed above, the first strip 36 extends from one of the first and second branches 48, 50. Therefore, the first strip 36 extends outwardly away from the finger 124 when in the first position such that the first strip 36 can be folded about the finger 124 as discussed further below.

The method 1000 also includes folding 1010 the first strip 36 of the flexible circuit body 32 about the finger 124 along the first hinge 42 to define a second position of the first strip 36 as shown in FIG. 7. Therefore, the flexible circuit body 32 remains substantially flat except for the first strip 36 when in the second position. In other words, the first strip 36 is in a folded position or the second position when folded about the finger 124.

Furthermore, folding 1010 the first strip 36 of the flexible circuit body 32 about the finger 124 along the first hinge 42 can include engaging the first strip 36 with a first tool 128 to fold the first strip 36 about the finger 124 along the first hinge 42. In certain embodiments, the first hinge 42 is further defined as the plurality of first hinges 42 such that one of the first hinges 42 is disposed between each of the first strain gauges 34. Therefore, folding 1010 the first strip 36 of the flexible circuit body 32 about the finger 124 along the first hinge 42 can further include folding the first strip 36 of the flexible circuit body 32 about the finger 124 along a pair of the first hinges 42 to further define the second position of the first strip 36. In addition, engaging the first strip 36 with the first tool 128 can further include engaging the first strip 36 with the first tool 128 to fold the first strip 36 about the finger 124 along the pair of the first hinges 42 to further define the second position of the first strip 36.

In certain embodiments, the finger 124 includes a first side 130, a second side 132 and a third side 134 disposed between the first and second sides 130, 132. In addition, in certain embodiments, the first tool 128 can be a fork 128. The fork 128 can have a first arm 136, a second arm 138 and a base 140 disposed between the first and second arms 136, 138 to define a space between the first and second arms 136, 138. Therefore, folding 1010 the first strip 36 or engaging the first strip 36 with the first tool 128 can include engaging a first part 142 of the first strip 36 with the first arm 136 to move the first part 142 between the first side 130 and the first arm 136, and can include bending one of the first hinges 42 as the first part 142 moves between the first side 130 and the first arm 136. Furthermore, folding 1010 the first strip 36 or engaging the first strip 36 with the first tool 128 can include engaging a second part 144 of the first strip 36 with the second arm 138 to move the second part 144 between the second side 132 and the second arm 138, and can include bending another one of the first hinges 42 as the second part 144 moves between the second side 132 and the second arm 138. It is to be appreciated that bending one of the first hinges 42 and bending another one of the first hinges 42 can occur simultaneously or one of the first hinges 42 can be bent before the other.

Therefore, the fork 128 surrounds the first, second and third sides 130, 132, 134 of the finger 124 when engaging the first strip 36. As such, folding 1010 the first strip 36 or engaging the first strip 36 with the first tool 128 can include disposing a third part 146 of the first strip 36 in the space between the base 140 and the third side 134. Hence, the method 1000 can further include securing 1012 the first strip 36 in the second position with the fork 128. Simply stated, the fork 128 sandwiches or pinches the first strip 36 against the finger 124 in the second position. When the first strip 36 is secured in the second position, at least one of the first strain gauges 34 is disposed between the first side 130 of the finger 124 and the first arm 136 of the fork 128, at least another one of the first strain gauges 34 is disposed between the second side 132 of the finger 124 and the second arm 138 of the fork 128, and at least yet another one of the first strain gauges 34 is disposed between the third side 134 of the finger 124 and the base 140 of the fork 128. Generally, securing 1012 the first strip 36 in the second position occurs after folding 1010 the first strip 36.

The mid-portion 122 of the first jig 120 can define a plurality of holes 148 to further define the first pattern 126. In addition, as discussed above, the flexible circuit body 32 can include the middle portion 44 defining the apertures 46. The holes 148 are further defined as first holes 148 for the below discussion. The method 1000 can further include inserting 1014 a first rod 150 through one of the first holes 148 and one of the apertures 46 to secure the flexible circuit body 32 including the first strain gauges 34, to the mid-portion 122 of the first jig 120. In addition, the method 1000 can include inserting 1016 a second rod 152 through another one of the first holes 148 and another one of the apertures 46 to align the flexible circuit body 32 including the first strain gauges 34, relative to the first pattern 126. Simply stated, the first rod 150 secures the circuit device 22 to the first jig 120 and the second rod 152 aligns the circuit device 22 relative to the first pattern 126. Generally, inserting 1014 the first rod 150 and inserting 1016 the second rod 152 occurs before folding 1010 the first strip 36. It is to be appreciated that the first and second rods 150, 152 can be substantially the same configuration or different configurations.

In one embodiment, inserting 1014 the first rod 150 through one of the first holes 148 and one of the apertures 46 occurs before inserting 1016 the second rod 152 through another one of the first holes 148 and another one of the apertures 46. In other words, the first rod 150 can be inserted into one of the first holes 148 and one of the apertures 46 before the second rod 152 is inserted into another one of the first holes 148 and another one of the apertures 46. In another embodiment, inserting 1016 the second rod 152 occurs before inserting 1014 the first rod 150. In yet another embodiment, inserting 1014 the first rod 150 through one of the first holes 148 and one of the apertures 46 occurs simultaneously with inserting 1016 the second rod 152 through another one of the first holes 148 and another one of the apertures 46. Simply stated, the first and second rods 150, 152 can be inserted simultaneously. In another embodiment, one of the first and second rods 150, 152 can be eliminated. Furthermore, in certain embodiments, inserting 1014 the first rod 150 and/or inserting 1016 the second rod 152 occurs before abutting 1008 the flexible circuit body 32 to the mid-portion 122. Hence, the flexible circuit body 32 can be slid onto the first and/or second rods 150, 152 through the apertures 46. Furthermore, in another embodiment, inserting 1014 the first rod 150 and/or inserting 1016 the second rod 152 occurs after abutting the 1008 the flexible circuit body 32 to the mid-portion 122 of the first pattern 126. It is to be appreciated that the first and/or second rods 150, 152 can be threaded and the first holes 148 of the mid-portion 122 of the first jig 120 can be threaded to receive the threaded first and/or second rods 150, 152. It is to further be appreciated that when the first and/or second rods 150, 152 are threaded, the middle portion 44 of the flexible circuit body 32 can be sandwiched between a lip of the first and/or second rods 150, 152 and the mid-portion 122 to clamp the flexible circuit body 32 to the first pattern 126.

In certain embodiments, the flexible circuit body 32 further includes the second strip 74 having the second hinge 78, and more specifically, the plurality of second hinges 78. As such, the method 1000 can include attaching 1018 the second strain gauges 76 to the second strip 74, with one of the second hinges 78 disposed between each of the second strain gauges 76, and with the second strip 74 being in a first position. Generally, the second strip 74 is unfolded when in the first position. Therefore, the second strip 74 is in an unfolded position or the first position when the flexible circuit body 32 is provided.

The second strain gauges 76 are attached to the flexible circuit body 32, and more specifically, attached to the second strip 74 to further define the circuit device 22. Attaching 1018 the second strain gauges 76 to the second strip 74 is performed with the second strip 74 being in the first position. As similarly discussed with the first strain gauges 34, the second strain gauges 76 can be attached to the flexible circuit body 32, and more specifically the second strip 74, by adhering as discussed above, soldering or any other suitable method to attach the second strain gauges 76 to the flexible circuit body 32. Specifically, the second strain gauges 76 can be attached to the flexible circuit body 32 utilizing the contact 104, the adhesive 112, etc. as discussed above.

The finger 124 of the first pattern 126 is further defined as a first finger 124, and wherein the mid-portion 122 of the first jig 120 further includes a second finger 154 extending from the mid-portion 122 to further define the first pattern 126. More specifically, the first and second fingers 124, 154 are spaced from each other. In certain configurations, the first finger 124 extends from one side wall 156 of the mid-portion 122 and the second finger 154 extends from another side wall 158 of the mid-portion 122. In one embodiment, the first and second side walls 156, 158 oppose each other. The first and second fingers 124, 154 can extend from the mid-portion 122 in any suitable location.

The first and second fingers 124, 154 can be substantially the same configuration. Therefore, the second finger 154 includes a first side 130, a second side 132 and a third side 134 disposed between the first and second sides 130, 132 as similarly discussed above for the first finger 124. When utilizing the first and second fingers 124, 154, the middle portion 44 of the flexible circuit body 32 abuts the mid-portion 122, the first branch 48 of the flexible circuit body 32 abuts the first finger 124 and the second branch 50 of the flexible circuit body 32 abuts the second finger 154. Therefore, the first strip 36 extends outwardly away from the first finger 124 when in the first position such that the first strip 36 can be folded about the first finger 124 as discussed further below. Similarly, the second strip 74 extends outwardly away from the second finger 154 when in the first position such that the second strip 74 can be folded about the second finger 154 as discussed further below. Specifically, the method 1000 can further include folding 1020 the second strip 74 of the flexible circuit body 32 about the second finger 154 along the second hinge 78 to define a second position of the second strip 74. It is to be appreciated that the first and second fingers 124, 154 can be different configurations.

As discussed above, the first strip 36 of the flexible circuit body 32 can be folded about the first finger 124 along the pair of the first hinges 42 to further define the second position of the first strip 36. Furthermore, folding 1020 the second strip 74 of the flexible circuit body 32 about the second finger 154 along the second hinge 78 can include folding the second strip 74 of the flexible circuit body 32 about the second finger 154 along at least one of the second hinges 78 to define the second position of the second strip 74. More specifically, folding the second strip 74 of the flexible circuit body 32 about the second finger 154 along at least one of the second hinges 78 can further include folding the second strip 74 of the flexible circuit body 32 about the second finger 154 along a pair of the second hinges 78 to further define the second position of the second strip 74.

As discussed above, the first strip 36 can be engaged with the first tool 128 to fold the first strip 36. Similarly for the second strip 74, folding 1020 the second strip 74 of the flexible circuit body 32 about the second finger 154 along the second hinge 78 can include engaging the second strip 74 with a second tool 160 to fold the second strip 74 about the second finger 154 along the second hinge 78. Engaging the second strip 74 with the second tool 160 can include engaging the second strip 74 with the second tool 160 to fold the second strip 74 about the second finger 154 along the pair of the second hinges 78 to further define the second position.

The first and second tools 128, 160 can be substantially the same configuration. Therefore, the second tool 160 can be a fork 160 having a first arm 136, a second arm 138 and a base 140. The fork 128 of the first tool 128 is referred to as the first fork 128 and the fork 160 of the second tool 160 is referred to as the second fork 160 below. Therefore, folding 1020 the second strip 74 or engaging the second strip 74 with the second tool 160 can include engaging a first part 142 of the second strip 74 with the first arm 136 of the second fork 160 to move the first part 142 of the second strip 74 between the first side 130 of the second finger 154 and the first arm 136 of the second fork 160, and can include bending one of the second hinges 78 as the first part 142 of the second strip 74 moves between the first side 130 of the second finger 154 and the first arm 136 of the second fork 160. Furthermore, folding 1020 the second strip 74 or engaging the second strip 74 with the second tool 160 can include engaging a second part 144 of the second strip 74 with the second arm 138 of the second fork 160 to move the second part 144 of the second strip 74 between the second side 132 of the second finger 154 and the second arm 138 of the second fork 160, and can include bending another one of the second hinges 78 as the second part 144 of the second strip 74 moves between the second side 132 of the second finger 154 and the second arm 138 of the second fork 160. It is to be appreciated that bending one of the second hinges 78 and bending another one of the second hinges 78 can occur simultaneously or one of the second hinges 78 can be bent before the other. It is to be appreciated that the first and second tools 128, 160 can be different configurations.

Generally, folding 1010 the first strip 36 of the flexible circuit body 32 occurs before folding 1020 the second strip 74 of the flexible circuit body 32. In certain embodiments, folding 1020 the second strip 74 of the flexible circuit body 32 occurs before folding 1010 the first strip 36 of the flexible circuit body 32. It is to be appreciated that folding 1010 the first strip 36 of the flexible circuit body 32 and folding 1020 the second strip 74 of the flexible circuit body 32 can occur simultaneously.

The first fork 128 surrounds the first, second and third sides 130, 132, 134 of the first finger 124 when engaging the first strip 36. Similarly, the second fork 160 surrounds the first, second and third sides 130, 132, 134 of the second finger 154 when engaging the second strip 74. As such, folding 1020 the second strip 74 or engaging the second strip 74 with the second tool 160 can include disposing a third part 146 of the second strip 74 in the space between the base 140 of the second fork 160 and the third side 134 of the second finger 154. Hence, the method 1000 can include securing 1022 the second strip 74 in the second position with the second fork 160. Simply stated, the second fork 160 sandwiches or pinches the second strip 74 against the second finger 154 in the second position. When the second strip 74 is secured in the second position, at least one of the second strain gauges 76 is disposed between the first side 130 of the second finger 154 and the first arm 136 of the second fork 160, at least another one of the second strain gauges 76 is disposed between the second side 132 of the second finger 154 and the second arm 138 of the second fork 160, and at least yet another one of the second strain gauges 76 is disposed between the third side 134 of the second finger 154 and the base 140 of the second fork 160. Generally, securing 1022 the second strip 74 in the second position occurs after folding 1020 the second strip 74.

The method 1000 can further including heating 1024 the first jig 120, the first fork 128, the first and second rods 150, 152 and the flexible circuit body 32 including the first strain gauges 34, in the heater 108, with the first strip 36 being in the second position. In other words, the first jig 120, the first fork 128, the first and second rods 150, 152, and the circuit device 22 can be heated in the heater 108, with the first strip 36 remaining in the second position during this heating process. In certain embodiments, heating 1024 the first jig 120 can include heating the first jig 120, the first and second forks 128, 160, the first and second rods 150, 152 and the circuit device 22 in the heater 108, with the first and second strips 36, 74 being in the second position. In other words, the first and second strips 36, 74 remain in the second position during this heating process. This heating process shapes or contours the first and second strips 36, 74 in the second position such that the first and second strips 36, 74 remain in the second position after being removed from the first jig 120. Generally, heating 1024 the first jig 120 occurs after securing 1012 the first strip 36 in the second position with the fork 128 and securing 1022 the second strip 74 in the second position with the second fork 160.

In certain embodiments, the first jig 120, the circuit device 32, etc. is heated in the heater 108 to a temperature from about 140° C. to about 160° C., for about 10 seconds to about 1 minute, 10 seconds. In one embodiment, the first jig 120, the circuit device 32, etc. is heated in the heater 108 to a temperature from about 150° C., for about 20 seconds to about 1 minute. The flexible circuit body 32 can be heated to shape or contour the first and/or second strips 36, 74 in the second position. As discussed above, it is to be appreciated that the heater 108 can be the oven, the hot plate, the vacuum oven or any other suitable heater 108. It is to further be appreciated that the first jig 120, the circuit device 32, etc. can be heated to any suitable temperature for any suitable amount of time.

The method 1000 can further include cooling 1026 the first jig 120, the first fork 128, the first and second rods 150, 152 and the flexible circuit body 32 including the first strain gauges 34, with the first strip 36 being in the second position. In other words, the first jig 120, the first fork 128, the first and second rods 150, 152, and the circuit device 22 can be cooled, with the first strip 36 remaining in the second position during this cooling process. In certain embodiments, cooling 1026 the first jig 120 can include cooling the first jig 120, the first and second forks 128, 160, the first and second rods 150, 152 and the circuit device 22, with the first and second strips 36, 74 remain in the second position during this cooling process. Generally, cooling 1026 the first jig 120 occurs after heating 1024 the first jig 120. In certain embodiments, the first jig 120, the circuit device 22, etc. is cooled at room temperature, for about 1 minute to about 5 minutes and cooled in ambient air. Generally, the first jig 120 is cooled until the circuit device 22 is cool to touch. It is to be appreciated that the first jig 120, the circuit device 22, etc. can be cooled by circulating air, a cooler, a fan, etc. It is to further be appreciated that the first jig 120, the circuit device 22, etc. can be cooled at any suitable temperature for any suitable amount of time.

In addition, the method 1000 includes removing 1028 the flexible circuit body 32 including the first strain gauges 34, from the first jig 120, with the first strip 36 remaining in the second position. More specifically, removing 1028 the flexible circuit body 32 can include removing the circuit device 22 from the first jig 120, with the first strip 36 remaining in the second position. Therefore, when the flexible circuit body 32 including the first strain gauges 34, is removed from the first jig 120, the first strip 36 remains in the second position and the remainder of the flexible circuit body 32 can remain substantially flat. Simply stated, the first strip 36 remains in the second position when removed from the first jig 120 while the remainder of the circuit device 22 can remain substantially flat. In certain embodiments, removing 1028 the flexible circuit body 32 can include removing the flexible circuit body 32 including the first and second strain gauges 34, 76, from the first jig 120, with the first and second strips 36, 74 remaining in the second position. Therefore, when the flexible circuit body 32 including the first and second strain gauges 34, 76, and thus the circuit device 22, is removed from the first jig 120, the first and second strips 36, 74 remain in the second position and the remainder of the flexible circuit body 32 can remain substantially flat.

Furthermore, removing 1028 the flexible circuit body 32 including the first strain gauges 34, from the first jig 120, with the first strip 36 remaining in the second position, occurs after cooling 1026 the first jig 120. In one embodiment, removing the flexible circuit body 32 including the first and second strain gauges 34, 76, from the first jig 120, with the first and second strips 36, 74 remaining in the second position, occurs after cooling the first jig 120. Simply stated, the circuit device 22 is removed from the first jig 120 after cooling the first jig 120.

In certain embodiments, removing 1028 the flexible circuit body 32 including the first strain gauges 34, and thus the circuit device 22, from the first jig 120 can include detaching the first and second rods 150, 152 from the first jig 120 and detaching the first and second rods 150, 152 from the flexible circuit body 32. In certain embodiments, removing the flexible circuit body 32 including the first and second strain gauges 34, 76, and thus the circuit device 22, from the first jig 120 can include removing the first rod 150 from one of the first holes 148 of the mid-portion 122 of the first jig 120, removing the first rod 150 from one of the apertures 46 of the middle portion 44 of the flexible circuit body 32, removing the second rod 152 from another one of the first holes 148 of the mid-portion 122 of the first jig 120, and removing the second rod 152 from another one of the apertures 46 of the middle portion 44 of the flexible circuit body 32. It is to be appreciated that the flexible circuit device 22 including the first and second strain gauges 34, 76 can be removed from the first jig 120 by any other suitable methods; and as one example, the flexible circuit body 32 including the first and second strain gauges 34, 76, and thus the circuit device 22, can be slid off the first and second rods 150, 152 to be removed from the first jig 120.

Additionally, removing 1028 the flexible circuit body 32 including the first strain gauges 34, and thus the circuit device 22, from the first jig 120 can include detaching the first tool 128 from the first jig 120. In certain embodiments, removing 1028 the flexible circuit body 32 including the first and second strain gauges 34, 76, and thus the circuit device 22, from the first jig 120 can include detaching the first and second tools 128, 160 from the first jig 120. More specifically, detaching the first tool 128 can include detaching the first tool 128 from the first finger 124. Similarly, detaching the second tool 160 can include detaching the second tool 160 from the second finger 154. In certain embodiments, the first and second tools 128, 160 can be detached from the first and second fingers 124, 154 before detaching the first and second rods 150, 152 from the flexible circuit body 32 or the first jig 120. In other embodiments, the first and second tools 128, 160 can be detached from the first and second fingers 124, 154 after detaching the first and second rods 150, 152 from the flexible circuit body 32 or the first jig 120.

Figure 15:
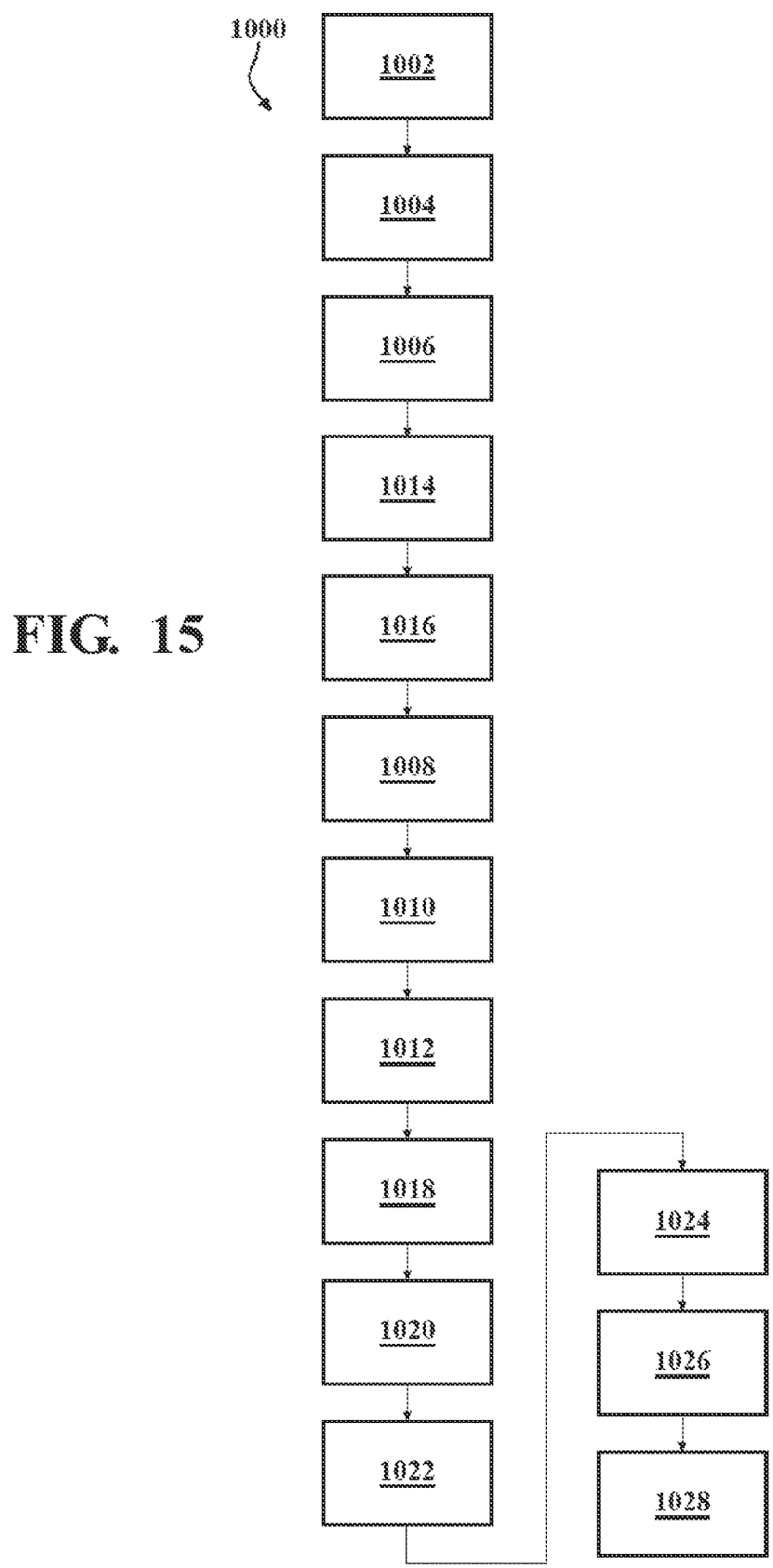
FIG. 15 is a schematic flowchart of a method of folding the circuit device of FIGS. 6 and 7.

The first jig 120 can further include a rest 162 adjacent the first pattern 126. The rest 162 supports the connector 100 of the flexible circuit body 32. Generally, the rest 162 is spaced from the first pattern 126 and generally aligns with the first pattern 126. The rest 162 can be substantially flat or any another suitable configuration for supporting the connector 100. Referring to FIG. 6, the first jig 120 can be further defined as a plurality of first jigs 120, with each of the first jigs 120 disposed adjacent to each other to fold a plurality of the flexible circuit bodies 32. It is to be appreciated that the order or sequence of performing the method 1000 as identified in the flowchart of FIG. 15 is for illustrative purposes and other orders or sequences are within the scope of the present disclosure. It is to also be appreciated that the method 1000 can include other features not specifically identified in the flowchart of FIG. 15.

As mentioned above, referring to FIGS. 8-13 and 16, the present disclosure provides another method 2000 of folding the circuit device 22. More specifically, this method 2000 folds the circuit device 22 and attaches the circuit device 22 to the support 52 to define the load cell assembly 20.

The method 2000 includes providing 2002 the flexible circuit body 32 including a strip 80 having a plurality of hinges 84, with the strip 80 being in an unfolded position. The strip 80 is further defined as the third strip 80 and will be referred to as the third strip 80 for this discussion and the hinges 84 are further defined as the third hinges 84 and will be referred to as the third hinges 84 for this discussion. Generally, the flexible circuit body 32 is substantially flat when provided. As such, the third strip 80 is unfolded when in the unfolded position. Therefore, the third strip 80 is in a first position or the unfolded position when the flexible circuit body 32 is provided. It is to be appreciated that the third strip 80 can have one third hinge 84 instead of the plurality of third hinges 84.

The method 2000 also includes attaching 2004 the plurality of strain gauges 82 to the third strip 80 to define the circuit device 22, with one of the third hinges 84 disposed between each of the strain gauges 82. The strain gauges 82 are further defined as the third strain gauges 82 and will be referred to as the third strain gauges 82 below. Generally, as suggested above, the third strain gauges 82 are attached to the flexible circuit body 32, and more specifically, attached to the third strip 80 to define the circuit device 22. Attaching 2004 the third strain gauges 82 to the third strip 80 are performed with the third strip 80 being in the first position. The third strain gauges 82 can be attached to the flexible circuit body 32, and more specifically the third strip 80, by adhering as discussed above, soldering or any other suitable method to attach the third strain gauges 82 to the flexible circuit body 32. Specifically, the third strain gauges 82 can be attached to the flexible circuit body 32 utilizing the contact 104, the adhesive 112, etc. as discussed above. It is to be appreciated that when utilizing one third hinge 84, the third hinge 84 is disposed between a pair of third strain gauges 82.

Referring to FIG. 8, the method 2000 further includes providing 2006 a jig 164 including a bottom part 166 defining a pattern 168. The jig 164 is further defined as a second jig 164 will be referred to as the second jig 164 below. In addition, the pattern 168 is further defined as a second pattern 168 will be referred to as the second pattern 168 below. When comparing FIGS. 6 and 8, the first and second jigs 120, 164 are configured different from each other. The first and second jigs 120, 164 can be used in conjunction with each other as discussed in detail below for the method 3000 of manufacturing.

In certain embodiments, the second jig 164 is formed of metal. In one embodiment, the second jig 164 is formed of an alloy. One suitable alloy is an aluminum alloy. It is to be appreciated that the second jig 164 can be formed of any suitable metal or material.

The method 2000 also includes providing 2008 the support 52 including the first portion 54, the second portion 56 and the bridge 62 disposed between the first and second portions 54, 56. The bridge 62 will be referred to as the first bridge 62 for the below discussion.

In addition, the method 2000 includes sandwiching 2010 the flexible circuit body 32 including the third strain gauges 82, between the support 52 and the second pattern 168 of the bottom part 166 such that the flexible circuit body 32 abuts at least one of the first and second portions 54, 56 of the support 52. In other words, the circuit device 22 is sandwiched between the support 52 and the second pattern 168 of the bottom part 166.

The bottom part 166 can include a first side portion 170, a second side portion 172 and a center portion 174 disposed between the first and second side portions 170, 172. The bottom part 166 of the second jig 164, and more specifically the center portion 174, can define a plurality of second holes 176 to further define the second pattern 168. In addition, as discussed above, the flexible circuit body 32 can include the middle portion 44 defining the apertures 46. Therefore, the method 2000 can further include inserting 2012 the first rod 150 through one of the second holes 176 and one of the apertures 46 to secure the flexible circuit body 32 including the third strain gauges 82, to the center portion 174 of the second jig 164. In addition, the method 2000 can include inserting 2014 the second rod 152 through another one of the second holes 176 and another one of the apertures 46 to align the flexible circuit body 32 including the third strain gauges 82, relative to the second pattern 168. In other words, inserting 2012 the first rod 150 through one of the second holes 176 and one of the apertures 46 secures the circuit device 22 to the bottom part 166 of the second jig 164 and inserting 2014 the second rod 152 through another one of the second holes 176 and another one of the apertures 46 aligns the circuit device 22 relative to the second pattern 168 of the bottom part 166. It is to be appreciated that one second hole 176 can be utilized instead of the plurality of second holes 176. Therefore, it is to be appreciated that any suitable number of second holes 176 can be utilized.

In one embodiment, inserting 2012 the first rod 150 through one of the second holes 176 of the center portion 174 and one of the apertures 46 of the flexible circuit body 32 occurs before inserting 2014 the second rod 152 through another one of the second holes 176 and another one of the apertures 46. In other words, the first rod 150 can be inserted into one of the second holes 176 and one of the apertures 46 before the second rod 152 is inserted into another one of the second holes 176 and another one of the apertures 46. In another embodiment, inserting 2014 the second rod 152 occurs before inserting 2012 the first rod 150. In yet another embodiment, inserting 2012 the first rod 150 through one of the second holes 176 and one of the apertures 46 occurs simultaneously with inserting 2014 the second rod 152 through another one of the second holes 176 and another one of the apertures 46. Simply stated, the first and second rods 150, 152 can be inserted simultaneously. In another embodiment, one of the first and second rods 150, 152 can be eliminated. In yet another embodiment, inserting 2012 the first rod 150 and/or inserting 2014 the second rod 152 occurs before sandwiching 2010 the flexible circuit body 32 between the support 52 and the second pattern 168. Hence, in certain embodiments, the flexible circuit body 32 can be slid onto the first and/or second rods 150, 152 through the apertures 46. It is to be appreciated that the first and/or second rods 150, 152 can be threaded such that the first and second rods 150, 152 are threaded into the second holes 176 of the center portion 174 of the second jig 164.

As discussed above, the support 52 defines the openings 60, and more specifically, the second portion 56 of the support 52 defines the openings 60. The method 2000 can further include inserting 2016 the first rod 150 through one of the openings 60 to secure the support 52 to the center portion 174 of the second jig 164. In addition, the method 2000 can include inserting 2018 the second rod 152 through another one of the openings 60 to align the support 52 relative to the second pattern 168. In certain embodiments, the support 52 can be slid onto the first and second rods 150, 152 by the openings 60. Generally, the flexible circuit body 32 is secured to the center portion 174 of the second jig 164 before securing the support 52 to the center portion 174 of the second jig 164. Furthermore, inserting 2016 the first rod 150 and inserting 2018 the second rod 152 occurs before sandwiching 2010 the flexible circuit body 32 between the support 52 and the second pattern 168. Therefore, the circuit device 22 is disposed between the second pattern 168 and the support 52 when secured to the center portion 174.

Figure 11:
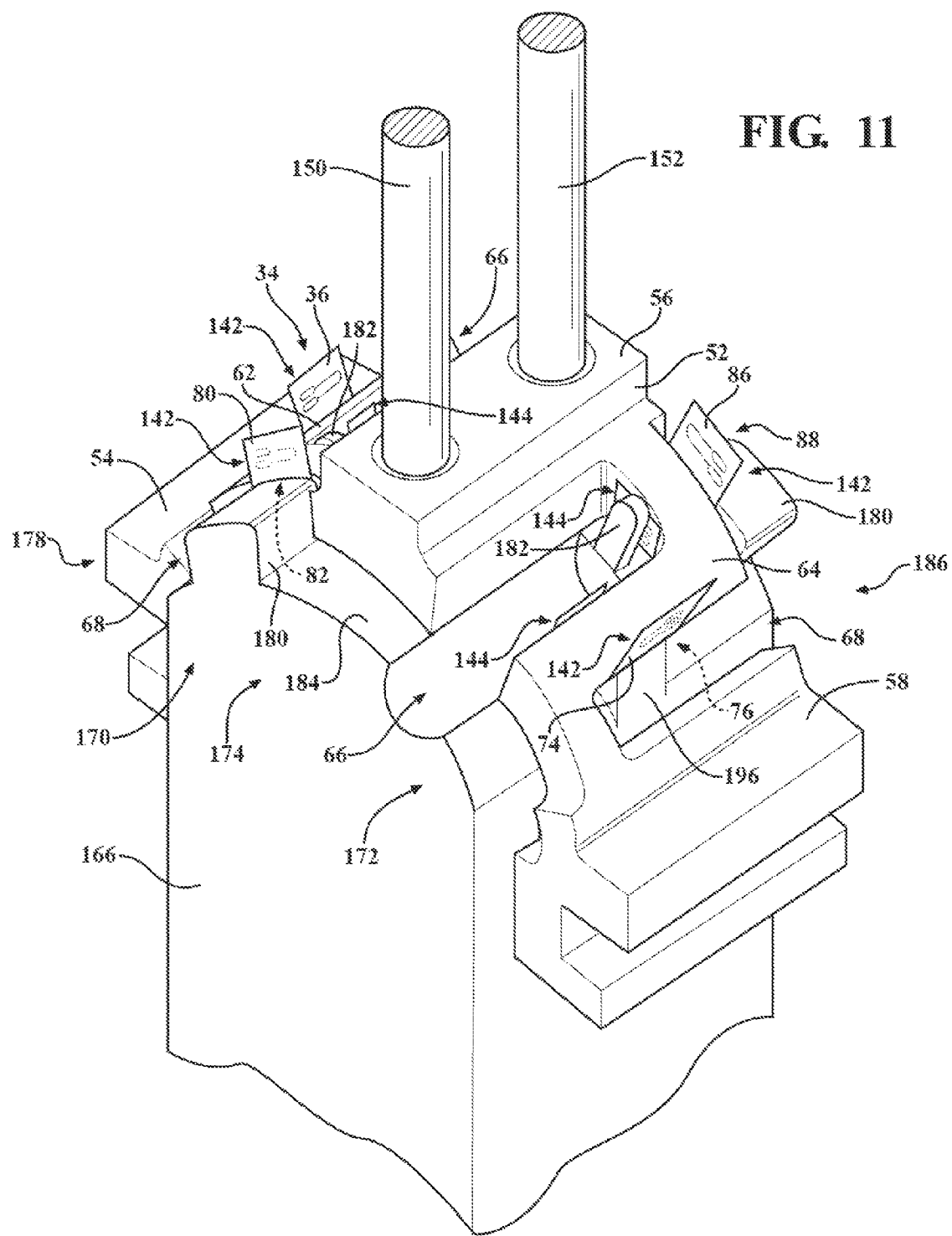
FIG. 11 is a schematic perspective view of the circuit device sandwiched between a bottom part of the second jig and the support such that the third and fourth strips are in a second position or first folded position.

Furthermore, the method 2000 includes folding 2020 the third strip 80 about the first bridge 62 along at least one of the third hinges 84 as the flexible circuit body 32 is sandwiched between the support 52 and the second pattern 168 of the bottom part 166 to define a first folded position of the third strip 80 (see FIG. 11). As such, the flexible circuit body 32 abuts one of the first sides 70 and contours to that configuration of the support 52 as the flexible circuit body 32 is sandwiched between the support 52 and the second pattern 168 except for the third strip 80 which has been folded to the first folded position. Therefore, the third strip 80 is in a second position or the first folded position when sandwiched between the support 52 and the second pattern 168 of the bottom part 166.

Turning to FIG. 8, the bottom part 166 of the second jig 164 can include a set of guides 178 to further define the second pattern 168. In one embodiment, the first side portion 170 of the bottom part 166 includes the set of guides 178. Therefore, folding 2020 the third strip 80 about the first bridge 62 along at least one of the third hinges 84 can include engaging the third strip 80 with the set of guides 178 as the flexible circuit body 32 is sandwiched between the support 52 and the second pattern 168 of the bottom part 166 to fold the third strip 80 along a pair of the third hinges 84 to further define the first folded position.

The set of guides 178 can include a first projection 180 and a second projection 182 spaced from each other, with the third strip 80 engaging the first and second projections 180, 182 as the first bridge 62 is disposed between the first and second projections 180, 182. Therefore, engaging the third strip 80 with the set of guides 178 can include engaging the third strip 80 with the first and second projections 180, 182 as the first bridge 62 is disposed between the first and second projections 180, 182. Hence, referring to FIGS. 9 and 11, a first part 142 of the third strip 80 is disposed between the first projection 180 and the first bridge 62, a second part 144 of the third strip 80 is disposed between the second projection 182 and the first bridge 62, and a third part 146 of the third strip 80 is disposed between a bottom surface 184 of the bottom part 166 and the first bridge 62 when the circuit device 22 is sandwiched between the support 52 and the bottom part 166 of the second jig 164. The set of guides 178 are further defined as a first set of guides 178 and will be referred to as the first set of guides 178 below.

In certain embodiments, the flexible circuit body 32 further includes the fourth strip 86 having the fourth hinge 90, and more specifically, the plurality of fourth hinges 90. The method 2000 can include attaching 2022 the plurality of fourth strain gauges 88 to the fourth strip 86 to further define the circuit device 22, with one of the fourth hinges 90 disposed between each of the fourth strain gauges 88, and with the fourth strip 86 being in a first position. Generally, the fourth strip 86 is unfolded when in the first position. Therefore, the fourth strip 86 is in an unfolded position or the first position when the flexible circuit body 32 is provided. As suggested above, the fourth strain gauges 88 are attached to the flexible circuit body 32, and more specifically, attached to the fourth strip 86 to define the circuit device 22. Attaching 2022 the fourth strain gauges 88 to the fourth strip 86 is performed with the fourth strip 86 being in the first position. The fourth strain gauges 88 can be attached to flexible circuit body 32, and more specifically the fourth strip 86, by adhering as discussed above, soldering or any other suitable method to attach the fourth strain gauges 88 to the flexible circuit body 32. Specifically, the fourth strain gauges 88 can be attached to the flexible circuit body 32 utilizing the contact 104, the adhesive 112, etc. as discussed above. It is to be appreciated that when utilizing one fourth hinge 90, the fourth hinge 90 is disposed between a pair of fourth strain gauges 88.

The method 2000 can include folding 2024 the fourth strip 86 about the second bridge 64 along at least one of the fourth hinges 90 as the flexible circuit body 32 is sandwiched between the support 52 and the second pattern 168 of the bottom part 166 to define a first folded position of the fourth strip 86 (see FIG. 11). As such, the flexible circuit body 32 abuts one of the first sides 70 and contours to that configuration of the support 52 as the flexible circuit body 32 is sandwiched between the support 52 and the second pattern 168 except for the third and fourth strips 80, 86 which has been folded to the first folded position. Therefore, the fourth strip 86 is in a second position or the first folded position when sandwiched between the support 52 and the second pattern 168 of the bottom part 166. When utilizing both the third and fourth strips 80, 86, the third and fourth strips 80, 86 can be folded simultaneously to the first folded position as the flexible circuit body 32 is sandwiched between the support 52 and the second pattern 168 of the bottom part 166. It is to be appreciated that the third strip 80 can be folded to the first folded position before the fourth strip 86 or the fourth strip 86 can be folded to the first folded position before the third strip 80.

Furthermore, in certain embodiments, the bottom part 166 of the second jig 164 can include a second set of guides 186 to further define the second pattern 168. In one embodiment, the second side portion 172 of the bottom part 166 includes the second set of guides 186. Therefore, folding 2024 the fourth strip 86 about the second bridge 64 along at least one of the fourth hinges 90 can include engaging the fourth strip 86 with the second set of guides 186 as the flexible circuit body 32 is sandwiched between the support 52 and the second pattern 168 of the bottom part 166 to fold the fourth strip 86 along a pair of the fourth hinges 90.

The first and second sets of guides 178, 186 can be substantially the same configuration. Therefore, in certain embodiments, the second set of guides 186 can include a first projection 180 and a second projection 182 spaced from each other, with the fourth strip 86 engaging the first and second projections 180, 182 of the second set of guides 186 as the second bridge 64 is disposed between the first and second projections 180, 182 of the second set of guides 186. Therefore, engaging the fourth strip 86 with the second set of guides 186 can include engaging the fourth strip 86 with the first and second projections 180, 182 of the second set of guides 186 as the second bridge 64 is disposed between the first and second projections 180, 182 of the second set of guides 186. Hence, referring to FIGS. 9 and 11, a first part 142 of the fourth strip 86 is disposed between the first projection 180 of the second set of guides 186 and the second bridge 64, a second part 144 of the fourth strip 86 is disposed between the second projection 182 of the second set of guides 186 and the second bridge 64, and a third part 146 of the fourth strip 86 is disposed between the bottom surface 184 of the bottom part 166 and the second bridge 64 when the circuit device 22 is sandwiched between the support 52 and the bottom part 166 of the second jig 164. Therefore, when the circuit device 22 is sandwiched between the support 52 and the bottom part 166 of the second jig 164, the flexible circuit body 32 engages the bottom surface 184 and the support 52 and one of the first sides 70 of the support 52. It is to be appreciated that the first and second sets of guides 178, 186 can be different configurations.

Referring to FIG. 9, the method 2000 can further include applying 2026 adhesive 188 to the flexible circuit body 32, with the adhesive 188 facing the support 52 to attach the flexible circuit body 32 and the support 52 to each other. In other words, adhesive 188 is applied to the top side 38 of the flexible circuit body 32, with the top side 38 of the flexible circuit body 32 facing the support 52. Therefore, the bottom side 40 of the flexible circuit body 32 faces the bottom part 166 of the second jig 164. Simply stated, the adhesive 188 is disposed between the support 52 and the flexible circuit body 32 to attach the support 52 and the flexible circuit body 32 to each other. As such, applying 2026 adhesive 188 to the flexible circuit body 32 occurs before sandwiching 2010 the flexible circuit body 32 between the support 52 and the second pattern 168. Simply stated, the adhesive 188 is applied to the flexible circuit body 32 before sandwiching the flexible circuit body 32 including the third and fourth strain gauges 82, 88, between the support 52 and the second pattern 168 of the bottom part 166. In other words, the adhesive 188 is applied to the flexible circuit body 32 before sandwiching the circuit device 22 between the support 52 and the second pattern 168 of the bottom part 166. Furthermore, applying 2026 adhesive 188 to the flexible circuit body 32 can occur before inserting 2012 the first rod 150 through one of the second holes 176 and one of the apertures 46 and inserting 2014 the second rod 152 through another one of the second holes 176 and another one of the apertures 46. It is to be appreciated that applying 2026 adhesive 188 to the flexible circuit body 32 can occur after inserting 2012 the first rod 150 through one of the second holes 176 and one of the apertures 46 and inserting 2014 the second rod 152 through another one of the second holes 176 and another one of the apertures 46. In certain embodiments, adhesive 188 is also applied to the third and/or fourth strain gauges 82, 88. Additional discussion of the adhesive 188 can be found below in the method 3000 of manufacturing.

Figure 12:
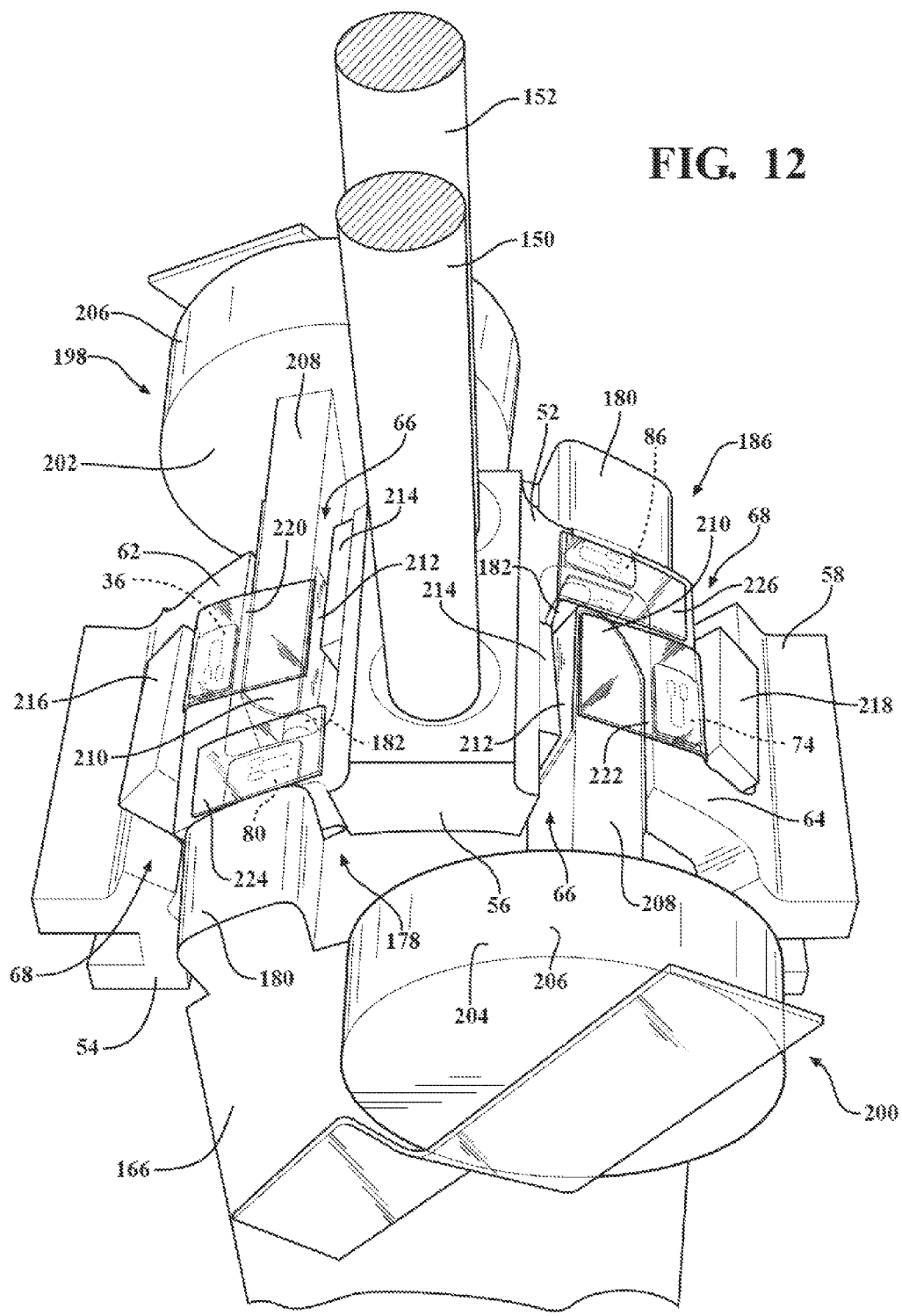
FIG. 12 is a schematic perspective view of the first, second, third and fourth strips being in a third position or second folded position.

Referring to FIG. 12, the method 2000 also includes folding 2028 the third strip 80 along another one of the third hinges 84 to define a second folded position of the third strip 80 such that the third strip 80 is wrapped about the first bridge 62 when in the second folded position to align the third strain gauges 82 about the first bridge 62 and to attach the flexible circuit body 32 and the support 52 to each other to define the load cell assembly 20. Therefore, the third strip 80 is in a third position or the second folded position when the third strip 80 is folded along another one of the third hinges 84.

When utilizing the fourth strip 86, the method 2000 can also include folding 2030 the fourth strip 86 along another one of the fourth hinges 90 to define a second folded position of the fourth strip 86 such that the fourth strip 86 is wrapped about the second bridge 64 when in the second folded position to align the fourth strain gauges 88 about the second bridge 64 and to attach the flexible circuit body 32 and the support 52 to each other to define the load cell assembly 20. Therefore, the fourth strip 86 is in a third position or the second folded position when the fourth strip 86 is folded along another one of the fourth hinges 90.

Referring to FIG. 12, the method 2000 can further include attaching 2032 a retainer 224 to the third strip 80 to secure the third strip 80 in the second folded position. The retainer 224 is referred to as a third retainer 224 in the below discussion. Generally, attaching 2032 the third retainer 224 to the third strip 80 occurs after folding 2028 the third strip 80 to the second folded position. In certain embodiments, attaching 2032 the third retainer 224 to the third strip 80 can include attaching the third retainer 224 to the third strip 80 and the first bridge 62 to secure the third strip 80 in the second folded position.

Similarly, the method 2000 can further include attaching 2034 a fourth retainer 226 to the fourth strip 86 to secure the fourth strip 86 in the second folded position. Generally, attaching 2034 the fourth retainer 226 to the fourth strip 86 occurs after folding 2030 the fourth strip 86 to the second folded position. In certain embodiments, attaching 2034 the fourth retainer 226 to the fourth strip 86 can include attaching the fourth retainer 226 to the fourth strip 86 and the second bridge 64 to secure the fourth strip 86 in the second folded position. Details of the third and fourth retainers 224, 226, as well as first and second retainers 220, 222, are discussed in detail below in the method 3000 of manufacturing.

In addition, the method 2000 can include attaching 2036 a top part 190 (see FIGS. 8 and 13) of the second jig 164 to the bottom part 166 of the second jig 164 while the third strip 80 is in the second folded position. More specifically, in certain embodiments, attaching 2036 the top part 190 to the bottom part 166 can including attaching the top part 190 to the bottom part 166 of the second jig 164 while the third and fourth strips 80, 86 are in the second folded position. Generally, the support 52 is sandwiched between the top and bottom parts 190, 166 of the second jig 164. Furthermore, the flexible circuit body 32, with the third and fourth strips 80, 86 in the second folded position, is sandwiched between the top and bottom parts 190, 166 of the second jig 164.

The top part 190 defines a recess 192 (see FIG. 8) for receiving the second portion 56 of the support 52. Generally, the top part 190 defines an arcuate configuration on either sides of the recess 192. Furthermore, the bottom surface 184 of the bottom part 166 defines an arcuate configuration. The arcuate configurations are generally complementary to the 3-dimensional configuration of the support 52. Therefore, when sandwiching 2010 the flexible circuit body 32 between the support 52 and the second pattern 168, the flexible circuit body 32 bends to complement the 3-dimensional configuration of the support 52. More specifically, the first and second branches 48, 50 and the middle portion 44 of the flexible circuit body 32 bend relative to the first and second bridges 62, 64 and the second portion 56 of the support 52. Therefore, as discussed above, the flexible circuit body 32 is flexible to allow bending or contouring of the flexible circuit body 32 to the support 52. It is to be appreciated that the top and bottom parts 190, 166 can be any suitable configuration.

Additionally, the top part 190 defines a plurality of third holes 194. The second holes 176 of the bottom part 166 and the third holes 194 of the top part 190 align with each other. Therefore, the method 2000 can include inserting 2038 the first rod 150 through one of the third holes 194 and inserting 2040 the second rod 152 through another one of the third holes 194. Generally, inserting 2038 the first rod 150 through one of the third holes 194 and inserting 2040 the second rod 152 through another one of the third holes 194 occurs simultaneously as the top part 190 moves toward the support 52. Attaching 2036 the top part 190 to the bottom part 166 of the second jig 164 occurs after attaching 2032 the third retainer 224 to the third strip 80. When utilizing the fourth strip 86, attaching 2036 the top part 190 to the bottom part 166 of the second jig 164 occurs after attaching 2034 the fourth retainer 226 to the fourth strip 86. It is to be appreciated that one third hole 194 can be utilized instead of the plurality of third holes 194. Therefore, it is to be appreciated that any suitable number of third holes 194 can be utilized.

Figure 14:
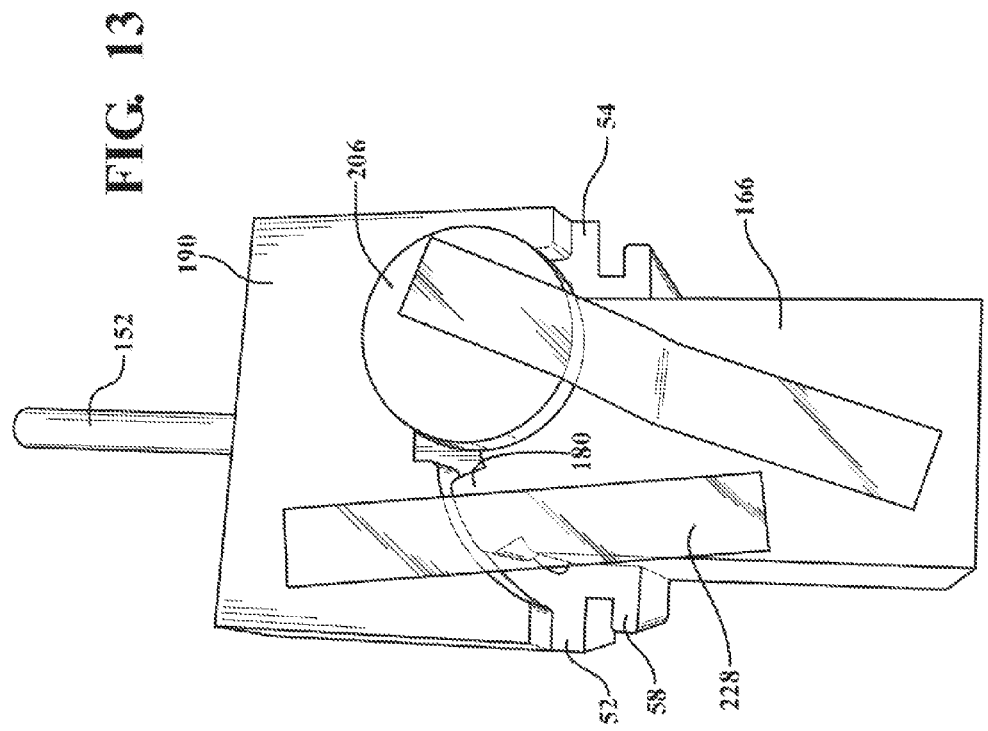
FIG. 14 is a schematic perspective view of a heater.

Furthermore, the method 2000 can include heating 2042 the second jig 164 including the top and bottom parts 190, 166, the flexible circuit body 32 including the third strain gauges 82 and the support 52 in the heater 108 (see FIG. 14). In certain embodiments, heating 2042 the second jig 164 can include heating the second jig 164 including the top and bottom parts 190, 166, the flexible circuit body 32 including the third and fourth strain gauges 82, 88 and the support 52 in the heater 108. Simply stated, heating 2042 the second jig 164 can include heating the second jig 164, the support 52 and the circuit device 22 in the heater 108, with the third and fourth strips 80, 86 being in the second folded position. The heater 108 can be the same heater 108 as discussed above and will not be re-discussed.

As suggested, the third strip 80 is secured in the second folded position during this heating process, and when utilizing the fourth strip 86, the fourth strip 86 is also secured in the second folded position during this heating process. In other words, the second jig 164, the first and second rods 150, 152, the support 52 and the circuit device 22 are heated in the heater 108. In certain embodiments, the second jig 164, the circuit device 22, etc. are heated in the heater 108 to a temperature from about 140° C. to about 160° C., for about 10 minutes to about 20 minutes. In one embodiment, the second jig 164, the circuit device 22, etc. are heated in the heater 108 a temperature from about 150° C., for about 15 minutes. Heating 2042 the second jig 164 cures the adhesive 188 to secure the third and fourth strips 80, 86 to the first and second bridges 62, 64, respectively of the support 52.

The method 2000 can include cooling 2044 the second jig 164 including the top and bottom parts 190, 166, the flexible circuit body 32 including the third strain gauges 82 and the support 52. In other words, the second jig 164, the first and second rods 150, 152, and the circuit device 22 can be cooled, with the third strip 80 remaining in the second folded position during this cooling process. When utilizing the fourth strip 86, the fourth strip 86 is cooled with the fourth strip 86 remaining in the second folded position during this cooling process. Generally, cooling 2044 the second jig 164 occurs after heating 2042 the second jig 164. In certain embodiments, the second jig 164, the circuit device 22, etc. are cooled at room temperature, for about 5 minutes to about 15 minutes and cooled in ambient air. Generally, the second jig 164 is cooled until the top and bottom parts 190, 166 of the second jig 164 are cool to touch. It is to be appreciated that the second jig 164, the circuit device 22, etc. can be cooled by circulating air, the cooler, the fan, etc. It is to further be appreciated that the second jig 164, the circuit device 22, etc. can be cooled at any suitable temperature for any suitable amount of time.

Figure 16:
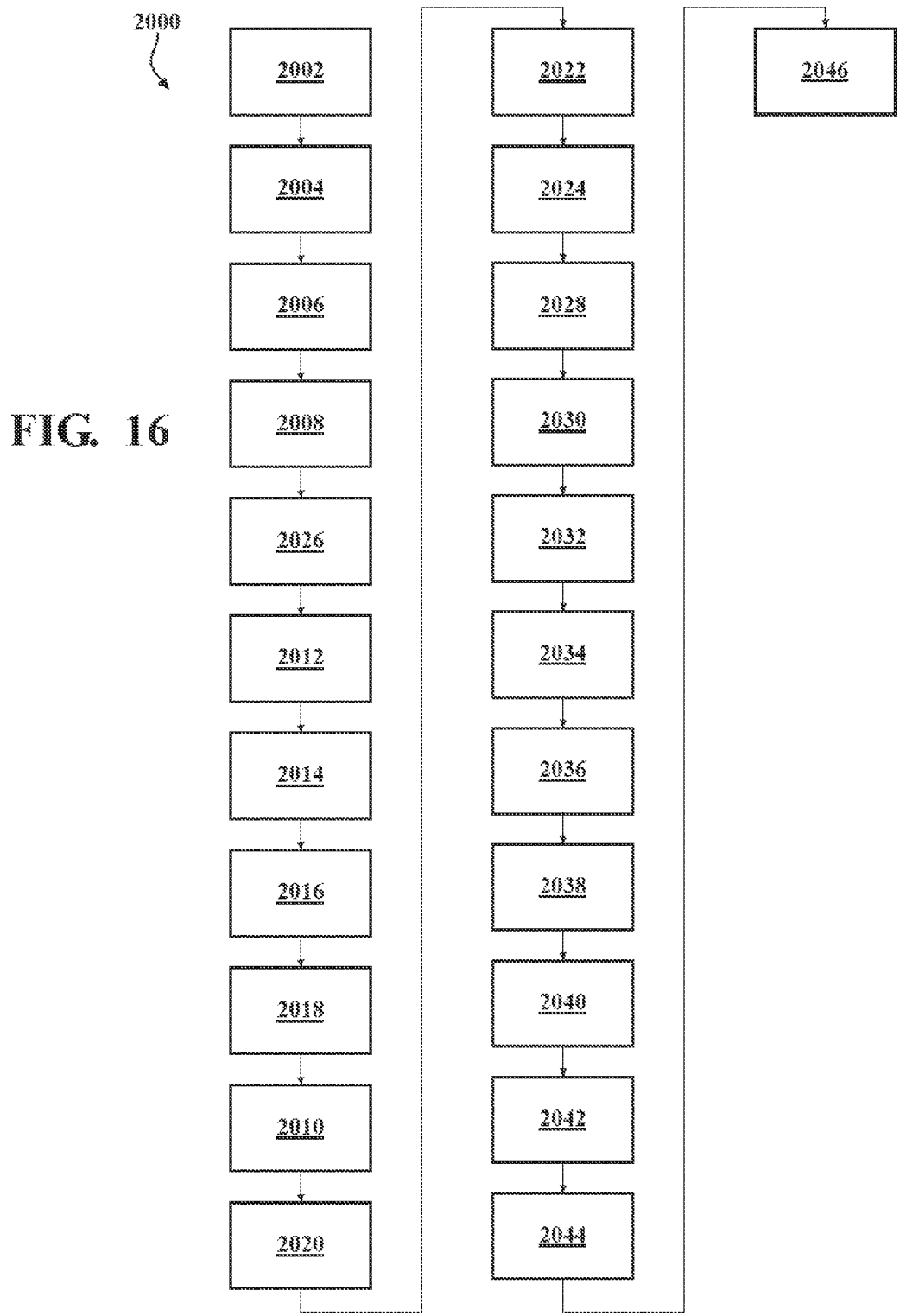
FIG. 16 is a schematic flowchart of another method of folding the circuit device of FIGS. 8-13.

In addition, the method 2000 can include removing 2046 the support 52 and the flexible circuit body 32 including the third strain gauges 82 from the second jig 164 as the load cell assembly 20, with the third strip 80 remaining in the second folded position such that the third strip 80 is wrapped about the first bridge 62 and the third strain gauges 82 surround the first bridge 62. More specifically, the circuit device 22 is removed from the second jig 164 as the modular unit such that the third strip 80 remains in the second folded position about the first bridge 62. In certain embodiments, removing 2046 the support 52 and the flexible circuit body 32 can include removing the support 52 and the flexible circuit body 32 including the third and fourth strain gauges 82, 88 from the second jig 164 as the load cell assembly 20, with the third and fourth strips 80, 86 remaining in the second folded position such that the third and fourth strips 80, 86 are wrapped about the first and second bridges 62, 64 respectively, and the third strain gauges 82 surround the first bridge 62 and the fourth strain gauges 88 surround the second bridge 64. More specifically, the support 52 and the circuit device 22 are removed from the second jig 164 as the modular unit such that the third and fourth strips 80, 86 remain in the second folded position about the first and second bridges 62, 64. When the load cell assembly 20 is removed from the second jig 164, the modular unit can then be attached to the robotic member 24. Details of removing the load cell assembly 20 from the second jig 164 are discussed below in the method 3000 of manufacturing. It is to be appreciated that the order or sequence of performing the method 2000 as identified in the flowchart of FIG. 16 is for illustrative purposes and other orders or sequences are within the scope of the present disclosure. It is to also be appreciated that the method 2000 can include other features not specifically identified in the flowchart of FIG. 16.

As also mentioned above, referring to FIGS. 6-13 and 17, the present disclosure provides a method 3000 of manufacturing the load cell assembly 20. Generally, this method 3000 utilizes both the first and second jigs 120, 164 as detailed above. Hence, the first jig 120 can be utilized to fold the first and second strips 36, 74 to the second position and the second jig 164 can be utilized to fold the third and fourth strips 80, 86 to the second position. In addition, the second jig 164 can be utilized to fold the first, second, third and fourth strips 36, 74, 80, 86 in the third position. Therefore, the methods 1000, 2000 discussed above are applicable below and not all of the details above are re-discussed below.

The method 3000 includes providing 3002 the flexible circuit body 32 including the strip 36 having the hinges 42, with the strip 36 being in the first position. The strip 36 is defined as the first strip 36 and the hinges 42 are defined as the first hinges 42 for this discussion. Generally, as discussed above, the flexible circuit body 32 is substantially flat when provided. As such, the first strip 36 is unfolded when in the first position. Therefore, the first strip 36 is in the first position or the unfolded position when the flexible circuit body 32 is provided.

The method 3000 further includes attaching 3004 the strain gauges 34 to the first strip 36 to define the circuit device 22, with one of the first hinges 42 disposed between each of the strain gauges 34. The strain gauges 34 are further defined as the first strain gauges 34 for the below discussion. Therefore, attaching 3004 the strain gauges 34 to the first strip 36 can include attaching the first strain gauges 34 to the first strip 36, with one of the first hinges 42 disposed between each of the first strain gauges 34, and with the first strip 36 being in the first position. Generally, the first strain gauges 34 are attached to the flexible circuit body 32, and more specifically, attached to the first strip 36 to define the circuit device 22. The first strain gauges 34 can be attached to the first strip 36 as discussed above in the method 1000.

In certain embodiments, the flexible circuit body 32 can further include the second strip 74 having the plurality of second hinges 78, the third strip 80 having the plurality of third hinges 84 and the fourth strip 86 having the plurality of fourth hinges 90 as discussed above. Therefore, the method 3000 can further include attaching 3006 the second strain gauges 76 to the second strip 74, with one of the second hinges 78 disposed between each of the second strain gauges 76, and with the second strip 74 being in the first position. The method 3000 can also include attaching 3008 the third strain gauges 82 to the third strip 80, with one of the third hinges 84 disposed between each of the third strain gauges 82, and with the third strip 80 being in the first position. In addition, the method 3000 can include attaching 3010 the fourth strain gauges 88 to the fourth strip 86, with one of the fourth hinges 90 disposed between each of the fourth strain gauges 88, and with the fourth strip 86 being in the first position. Attaching 3004 the first strain gauges 34 to the first strip 36 is performed while the first strip 36 is in the first position, attaching 3006 the second strain gauges 76 to the second strip 74 is performed while the second strip 74 is in the first position, attaching 3008 the third strain gauges 82 to the third strip 80 is performed while the third strip 80 is in the first position and attaching 3010 the fourth strain gauges 88 to the fourth strip 86 is performed while the fourth strip 86 is in the first position. Furthermore, the first, second, third and fourth strips 36, 74, 80, 86 and the first, second, third and fourth strain gauges 34, 76, 82, 88 further define the circuit device 22.

The first, second, third and fourth strips 36, 74, 80, 86 can be substantially the same configuration and can have different orientations. For example, the first and third strips 36, 80 can extend from the first branch 48 in different orientations. Similarly, the second and fourth strips 74, 86 can extend from the second branch 50 in different orientations. It is to be appreciated that the first, second, third and/or fourth strips 36, 74, 80, 86 can extend from first and second branches 48, 50 respectively in any suitable orientation. It is to also be appreciated that the first, second, third and/or fourth strips 36, 74, 80, 86 can have different configurations.

Referring to FIGS. 6 and 7, the method 3000 also includes providing 3012 the first jig 120 including the mid-portion 122 and the first finger 124 extending from the mid-portion 122 to define the first pattern 126. The mid-portion 122 is complementary to the middle portion 44 of the flexible circuit body 32 and the first finger 124 is complementary to one of the first and second branches 48, 50 of the flexible circuit body 32 as discussed above.

In addition, the method 3000 includes abutting 3014 the circuit device 22 to the mid-portion 122 of the first pattern 126, with the first strip 36 remaining in the first position. Therefore, the middle portion 44 of the flexible circuit body 32 abuts the mid-portion 122 and one of the first and second branches 48, 50 abuts the first finger 124. In one embodiment, the first branch 48 abuts the first finger 124 and thus, the first strip 36 extends outwardly away from the first finger 124 when in the first position such that the first strip 36 can be folded about the first finger 124 as discussed below.

The method 3000 further includes folding 3016 the first strip 36 of the flexible circuit body 32 about the first finger 124 along at least one of the first hinges 42 to define the second position of the first strip 36. Furthermore, folding 3016 the first strip 36 of the flexible circuit body 32 about the first finger 124 along at least one of the first hinges 42 can include engaging the first strip 36 with the first tool 128 to fold the first strip 36 about the first finger 124 along the pair of the first hinges 42 to further define the second position of the first strip 36. In certain embodiments, the first tool 128 is the first fork 128 including the first arm 136, the second arm 138 and the base 140 disposed between the first and second arms 136, 138 to define the space between the first and second arms 136, 138 as discussed above. Furthermore as discussed above, in certain embodiments, the first finger 124 includes the first side 130, the second side 132 and the third side 134 disposed between the first and second sides 130, 132.

Therefore, engaging the first strip 36 with the first tool 128 can include engaging the first part 142 of the first strip 36 with the first arm 136 of the first fork 128 to move the first part 142 of the first strip 36 between the first side 130 of the first finger 124 and the first arm 136 of the first fork 128. Engaging the first strip 36 with the first tool 128 can further include bending one of the first hinges 42 as the first part 142 of the first strip 36 moves between the first side 130 of the first finger 124 and the first arm 136 of the first fork 128. In addition, engaging the first strip 36 with the first tool 128 can include engaging the second part 144 of the first strip 36 with the second arm 138 of the first fork 128 to move the second part 144 of the first strip 36 between the second side 132 of the first finger 124 and the second arm 138 of the first fork 128. Furthermore, engaging the first strip 36 with the first tool 128 can include bending another one of the first hinges 42 as the second part 144 of the first strip 36 moves between the second side 132 of the first finger 124 and the second arm 138 of the first fork 128, and disposing a third part 146 of the first strip 36 in the space between the base 140 of the first fork 128 and the third side 134 of the first finger 124.

As also discussed above, the mid-portion 122 of the first jig 120 can further include the second finger 154 extending from the mid-portion 122 to further define the first pattern 126. Therefore, abutting 3014 the circuit device 22 to the mid-portion 122 of the first pattern 126 can include abutting the middle portion 44 of the flexible circuit body 32 to the mid-portion 122 of the first patter 126, abutting the first branch 48 to the first finger 124 and abutting the second branch 50 to the second finger 154. Thus, the first strip 36 extends outwardly away from the first finger 124 when in the first position such that the first strip 36 can be folded about the first finger 124 and the second strip 74 extends outwardly away from the second finger 154 when in the first position such that the second strip 74 can be folded about the second finger 154 as discussed below.

The method 3000 can include folding 3018 the second strip 74 of the flexible circuit body 32 about the second finger 154 along at least one the second hinges 78 to define the second position of the second strip 74. Generally, the method 3000 can also include maintaining 3020 the third and fourth strips 80, 86 in the first position while folding 3016, 3018 the first and second strips 36, 74 about the first and second fingers 124, 154 respectively. Furthermore, folding 3018 the second strip 74 of the flexible circuit body 32 about the second finger 154 along at least one the second hinges 78 can include engaging the second strip 74 with the second tool 160 to fold the second strip 74 about the second finger 154 along the pair of the second hinges 78 to further define the second position. Additional details of folding the second strip 74 with the second tool 160 or the second fork 160 are discussed above in the method 1000 and will not be re-discussed.

The method 3000 can also include securing 3022 the first strip 36 in the second position with the first tool 128. More specifically, the first strip 36 is secured in the second position with the first fork 128. Similarly, the method 3000 can include securing 3024 the second strip 74 in the second position with the second tool 160. Additional details of securing the first and second strips 36, 74 in the second position with the first and second tools 128, 160 are discussed above in the method 1000 and will not be re-discussed.

As mentioned above, the mid-portion 122 of the first jig 120 defines the first holes 148 to further define the first pattern 126 and the flexible circuit body 32 includes the middle portion 44 defining the plurality of apertures 46. The method 3000 can further include inserting 3026 the first rod 150 through one of the first holes 148 and one of the apertures 46 to secure the circuit device 22 to the mid-portion 122 of the first jig 120 and inserting 3028 the second rod 152 through another one of the first holes 148 and another one of the apertures 46 to align the circuit device 22 relative to the first pattern 126. Additional details of the first and second rods 150, 152, as well as the details of inserting, securing and aligning are discussed above in the method 1000 and will not be re-discussed.

The method 3000 can further include heating 3030 the first jig 120, the first tool 128, the first and second rods 150, 152 and the circuit device 22 in the heater 108 (see FIG. 14), with the first strip 36 being in the second position. More specifically, heating 3030 the first jig 120, etc. can include heating the first jig 120, the first and second tools 128, 160 and the circuit device 22 in the heater 108, with the first and second strips 36, 74 being in the second position, and with the third and fourth strips 80, 86 being in the first position. In other words, the first and second strips 36, 74 are in the second position when being heated with the first jig 120 and the third and fourth strips 80, 86 are in the first position when heated with the first jig 120. Additional details of heating the first jig 120, etc., such as temperature, time, etc., are discussed above in the method 1000 and will not be re-discussed.

In addition, the method 3000 can include cooling 3032 the first jig 120, the first tool 128, the first and second rods 150, 152 and the circuit device 22, with the first strip 36 being in the second position. More specifically, cooling 3032 the first jig 120, etc. can include cooling the first jig 120, the first and second tools 128, 160 and the circuit device 22, with the first and second strips 36, 74 being in the second position, and with the third and fourth strips 80, 86 being in the first position. In other words, the first and second strips 36, 74 are in the second position when being cooled with the first jig 120 and the third and fourth strips 80, 86 are in the first position when cooled with the first jig 120. Generally, cooling 3032 the first jig 120 occurs after heating 3030 the first jig 120. Additional details of cooling the first jig 120, etc., such as temperature, time, etc., are discussed above in the method 1000 and will not be re-discussed.

The method 3000 also includes removing 3034 the circuit device 22 from the first jig 120, with the first strip 36 remaining in the second position. More specifically, removing 3034 the circuit device 22 from the first jig 120 can include removing the circuit device 22 from the first jig 120, with the first and second strips 36, 74 remaining in the second position, and with the third and fourth strips 80, 86 remaining in the first position. Generally, removing 3034 the circuit device 22 from the first jig 120, with the first strip 36 remaining in the second position, and more specifically, the first and second strips 36, 74 remaining in the second position, occurs after cooling 3032 the first jig 120. Additional details of removing the circuit device 22 from the first jig 120 are discussed above in the method 1000 and will not be re-discussed.

In addition, referring to FIGS. 8-13, the method 3000 includes providing 3036 the second jig 164 including the bottom part 166 defining the second pattern 168. Furthermore, the method 3000 includes providing 3038 the support 52 including the first portion 54, the second portion 56 and the first bridge 62 disposed between the first and second portions 54, 56. Generally, the first jig 120 is utilized before the second jig 164. Therefore, the first and second strips 36, 74 are folded or bent to the second position before utilizing the second jig 164 and the third and fourth strips 80, 86 remain in the first position before utilizing the second jig 164. It is to be appreciated that, optionally, a release agent can be applied to the second jig 164 to minimize bonding of the circuit device 22 to the second jig 164. Generally, the release agent is applied to the second jig 164 before securing the circuit device 22 to the second jig 164 as discussed below.

Furthermore, as shown in FIG. 9, the method 3000 can include applying 3040 adhesive 188 to the flexible circuit body 32, with the adhesive 188 facing the support 52 to attach the circuit device 22 and the support 52 to each other. Generally, applying 3040 the adhesive 188 occurs after removing 3034 the circuit device 22 from the first jig 120. Therefore, the adhesive 188 can be applied to the flexible circuit body 32 before securing the circuit device 22 to the second jig 164 with the first and second rods 150, 152. In other embodiments, the adhesive 188 can be applied to the flexible circuit body 32 after securing the circuit device 22 to the second jig 164 with the first and second rods 150, 152. Securing the flexible circuit body 32, and more specifically the circuit device 22, to the second jig 164 with the first and second rods 150, 152 are discussed above in the method 2000 and will not be re-discussed.

In certain embodiments, adhesive 188 is applied to the top side 38 of the flexible circuit body 32. More specifically, adhesive 188 can be applied to the top side 38 of the flexible circuit body 32 and the first, second, third and fourth strain gauges 34, 76, 82, 88 as shown in FIG. 9. The adhesive 188 can also be applied to the middle portion 44 of the flexible circuit body 32 as shown in FIG. 9.

The adhesive 188 can be formed of a non-conductive material. In certain embodiments, the non-conductive material of the adhesive 188 can be a two-component adhesive such as two-component epoxy-phenolic adhesive. One suitable type of adhesive 188 is commercially available under the trade name M-Bond 610 Adhesive from Allied High Tech Products, Inc. of Rancho Dominguez, Calif. It is to be appreciated that any suitable non-conductive adhesive or epoxy can be utilized.

Figure 10:
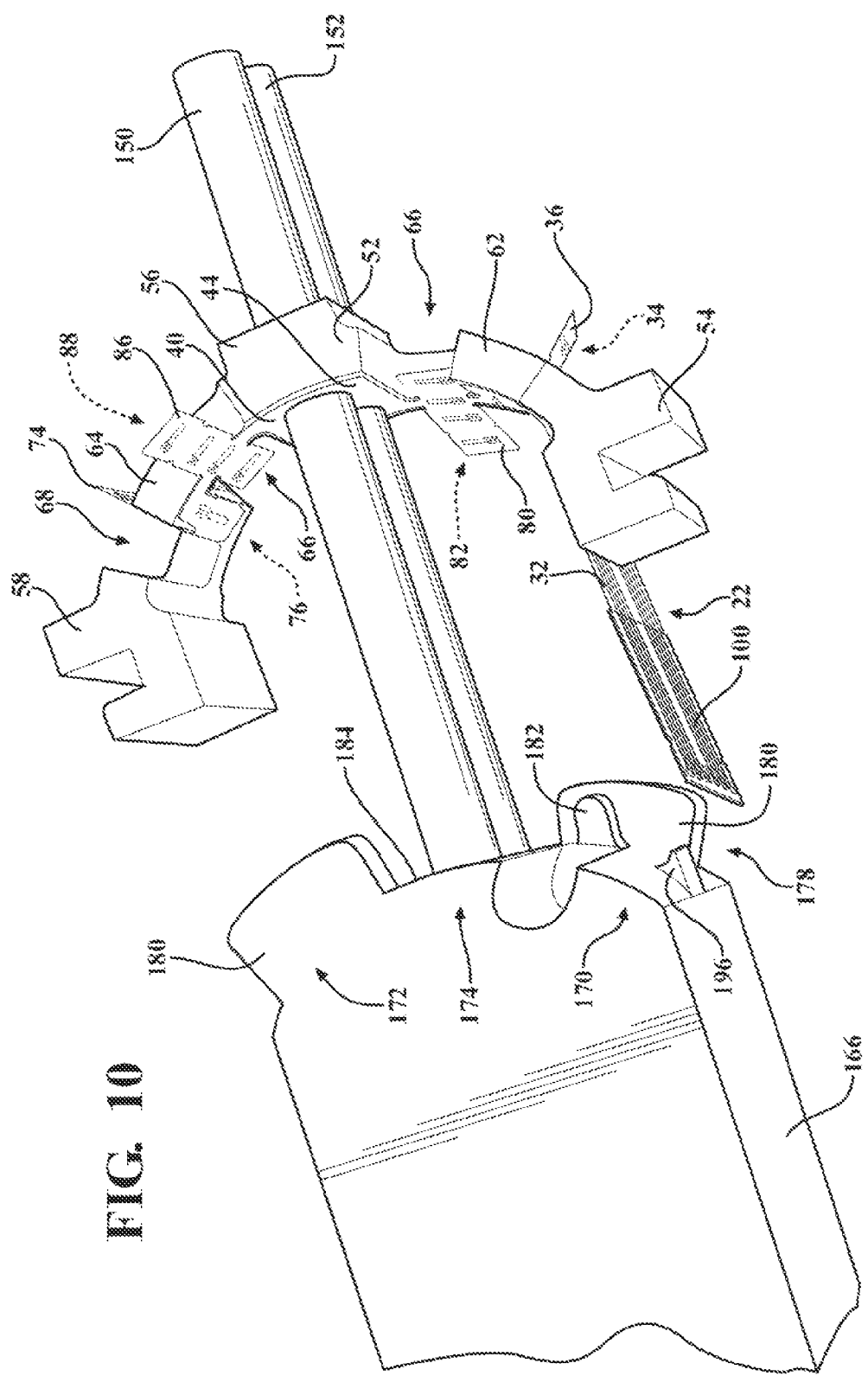
FIG. 10 is a schematic perspective view of the first strip disposed about a first bridge in the second position and the second strip disposed about a second bridge in the second position, with the third and fourth strips being in the first position.

The method 3000 also includes guiding 3042 the first strip 36 in the second position about the first bridge 62 of the support 52 (see FIG. 10). As discussed above, the support 52 can further include the third portion 58 and the second bridge 64 disposed between the second and third portions 56, 58. Therefore, in certain embodiments, the method 3000 can also include guiding 3044 the second strip 74 in the second position about the second bridge 64 of the support 52 (see FIG. 10). In certain embodiments, guiding 3042 the first strip 36 occurs before guiding 3044 the second strip 74. In other embodiments, guiding 3042 the first strip 36 occurs after guiding 3044 the second strip 74. It is to be appreciated that the first and second strips 36, 74 can be guided simultaneously. Furthermore, guiding 3042 the first strip 36 and guiding 3044 the second strip 74 occur after applying 3040 the adhesive 188.

Referring to FIGS. 11 and 12, the method 3000 further includes sandwiching 3046 the circuit device 22 between the support 52 and the second pattern 168 of the bottom part 166 such that the flexible circuit body 32 abuts at least one of the first and second portions 54, 56 of the support 52, with the first strip 36 remaining in the second position about the first bridge 62. Hence, the first strip 36 remains in the second position during guiding 3042 the first strip 36 about the first bridge 62 and sandwiching 3046 the circuit device 22 between the support 52 and the second pattern 168. Furthermore, when utilizing the second strip 74, the second strip 74 remains in the second position during guiding 3044 the second strip 74 about the second bridge 64 and sandwiching 3046 the circuit device 22 between the support 52 and the second pattern 168. Generally, guiding 3042 the first strip 36 in the second position about the first bridge 62 of the support 52 occurs before sandwiching 3046 the circuit device 22 between the support 52 and the second pattern 168 of the bottom part 166. More specifically, guiding 3042, 3044 the first and second strips 36, 74 about the first and second bridges 62, 64 respectively occur before sandwiching 3046 the circuit device 22 between the support 52 and the second pattern 168. Therefore, applying 3040 adhesive 188 to the flexible circuit body 32 occurs before sandwiching 3046 the circuit device 22 between the support 52 and the second pattern 168.

Furthermore, the method 3000 can include folding 3048 the third strip 80 about the first bridge 62 along at least one of the third hinges 84 as the circuit device 22 is sandwiched between the support 52 and the second pattern 168 of the bottom part 166 to define the second position of the third strip 80 (see FIG. 11). Therefore, the third strip 80 is in the first folded position when sandwiched between the support 52 and the second pattern 168 of the bottom part 166.

As best shown in FIG. 8, the bottom part 166 of the second jig 164 can include the first side portion 170, the second side portion 172 and the center portion 174 disposed between the first and second side portions 170, 172 as discussed above. In addition, the first side portion 170 can include the first set of guides 178 and the second side portion 172 can include the second set of guides 186 to further define the second pattern 168 as discussed above. Therefore, folding 3048 the third strip 80 about the first bridge 62 along at least one of the third hinges 84 can include engaging the third strip 80 with the first set of guides 178 as the circuit device 22 is sandwiched between the support 52 and the second pattern 168 of the bottom part 166 to fold the third strip 80 along the pair of the third hinges 84 about the first bridge 62 to further define the second position of the third strip 80.

In addition, the method 3000 can include folding 3050 the fourth strip 86 about the second bridge 64 along at least one of the fourth hinges 90 as the circuit device 22 is sandwiched between the support 52 and the second pattern 168 of the bottom part 166 to define the second position of the fourth strip 86 (see FIG. 11). Therefore, the fourth strip 86 is in the first folded position when sandwiched between the support 52 and the second pattern 168 of the bottom part 166.

Furthermore, folding 3050 the fourth strip 86 about the second bridge 64 along at least one of the fourth hinges 90 can include engaging the fourth strip 86 with the second set of guides 186 as the circuit device 22 is sandwiched between the support 52 and the second pattern 168 of the bottom part 166 to fold the fourth strip 86 along the pair of the fourth hinges 90 about the second bridge 64 to further define the second position of the fourth strip 86. In one embodiment, the third and fourth strips 80, 86 are folded to the second position after the first and second strips 36, 74 have been folded to the second position.

As set forth above, the first and second sets of guides 178, 186 can each include the first projection 180 and the second projection 182. Therefore, engaging the third strip 80 with the first set of guides 178 can include the third strip 80 engaging the first and second projections 180, 182 of the first set of guides 178 as the first bridge 62 is disposed between the first and second projections 180, 182 of the first set of guides 178. Similarly, engaging the fourth strip 86 with the second set of guides 186 can include engaging the first and second projections 180, 182 of the second set of guides 186 as the second bridge 64 is disposed between the first and second projections 180, 182 of the second set of guides 186. Additional details of engaging the third and fourth strips 80, 86 with the first and second sets of guides 178, 186 are discussed above in the method 2000 and will not be re-discussed.

The first and second sets of guides 178, 186 can each further include a ramp 196. Generally, the ramp 196 of the first set of guides 178 is spaced from the first and second projections 180, 182 of the first set of guides 178. In addition, the ramp 196 of the second set of guides 186 is spaced from the first and second projections 180, 182 of the second set of guides 186. In certain embodiments, the first side portion 170 of the bottom part 166 includes the ramp 196 of the first set of guides 178 and the second side portion 172 of the bottom part 166 includes the ramp 196 of the second set of guides 186. It is to be appreciated that the first and second sets of guides 178, 186 can be in any suitable configuration and location.

The method 3000 can further include engaging 3052 the first strip 36 in the second position with the ramp 196 of the first set of guides 178 as the circuit device 22 is sandwiched between the support 52 and the second pattern 168 of the bottom part 166. Therefore, the first strip 36, while in the second position, engages the ramp 196 of the first set of guides 178 when the circuit device 22 is sandwiched between the support 52 and the second pattern 168. Specifically, the first part 142 of the first strip 36 engages the ramp 196 of the first set of guides 178 when the circuit device 22 is sandwiched between the support 52 and the second pattern 168 of the bottom part 166. The ramp 196 of the first set of guides 178 assists in positioning the first strip 36 relative to the first bridge 62.

Similarly, the method 3000 can further include engaging 3054 the second strip 74 in the second position with the ramp 196 of the second set of guides 186 as the circuit device 22 is sandwiched between the support 52 and the second pattern 168 of the bottom part 166. Therefore, the second strip 74, while in the second position, engages the ramp 196 of the second set of guides 186 when the circuit device 22 is sandwiched between the support 52 and the second pattern 168. Specifically, the first part 142 of the second strip 74 engages the ramp 196 of the second set of guides 186. The ramp 196 of the second set of guides 186 assists in positioning the second strip 74 relative to the second bridge 64.

The method 3000 also includes folding 3056 the first strip 36 about the first bridge 62 along another one of the first hinges 42 to define a third position of the first strip 36 such that the first strip 36 is wrapped about the first bridge 62 when in the third position to align the first strain gauges 34 about the first bridge 62 and to attach the circuit device 22 and the support 52 to each other to define the load cell assembly 20. Therefore, the first strip 36 is in a second folded position or the third position when the first strip 36 is folded along another one of the first hinges 42. Generally, folding 3056 the first strip 36 about the first bridge 62 to the third position occurs after guiding 3042 the first strip 36 in the second position about the first bridge 62 of the support 52.

In addition, the method 3000 can include folding 3058 the second strip 74 about the second bridge 64 along another one of the second hinges 78 to define a third position of the second strip 74 such that the second strip 74 is wrapped about the second bridge 64 when in the third position to align the second strain gauges 76 about the second bridge 64 and to attach the circuit device 22 and the support 52 to each other. Generally, folding 3058 the second strip 74 about the second bridge 64 to the third position occurs after guiding 3044 the second strip 74 in the second position about the second bridge 64 of the support 52.

Referring to FIG. 12, the method 3000 can also include folding 3060 the third strip 80 about the first bridge 62 along another one of the third hinges 84 to define the third position of the third strip 80 such that the third strip 80 is wrapped about the first bridge 62 when in the third position to align the third strain gauges 82 about the first bridge 62 and to attach the circuit device 22 and the support 52 to each other. Simply stated, the first and third strips 36, 80 are wrapped about the first bridge 62 in a spaced relationship, with the first and third strain gauges 34, 82 surrounding the first bridge 62. Therefore, the first pair of strain gauges are wrapped about the opposite first sides 70 of the first bridge 62 and the second pair of strain gauges are wrapped about the opposite second sides 72 of the first bridge 62 adjacent to the first pair of strain gauges. Similarly, the fifth pair of strain gauges are wrapped about the opposite first sides 70 of the first bridge 62 and the sixth pair of strain gauges are wrapped about the opposite second sides 72 of the first bridge 62 adjacent to the fifth pair of strain gauges. As such, utilizing the circuit device 22 provides an efficient way to align the first, second, fifth and sixth pairs of strain gauges to the opposite first and second sides 70, 72 of the first bridge 62. Generally, folding 3060 the third strip 80 about the first bridge 62 to the third position occurs after guiding 3042, 3044 the first and second strips 36, 74 in the second position about the first and second bridges 62, 64 respectively.

In addition, the method 3000 can include folding 3062 the fourth strip 86 about the second bridge 64 along another one of the fourth hinges 90 to define the third position of the fourth strip 86 such that the fourth strip 86 is wrapped about the second bridge 64 when in the third position to align the fourth strain gauges 88 about the second bridge 64 and to attach the circuit device 22 and the support 52 to each other. Simply stated, the second and fourth strips 74, 86 are wrapped about the second bridge 64 in a spaced relationship, with the second and fourth strain gauges 76, 88 surrounding the second bridge 64. Therefore, the third pair of strain gauges are wrapped about the opposite first sides 70 of the second bridge 64 and the fourth pair of strain gauges are wrapped about the opposite second sides 72 of the second bridge 64 adjacent to the third pair of strain gauges. Similarly, the seventh pair of strain gauges are wrapped about the opposite first sides 70 of the second bridge 64 and the eighth pair of strain gauges are wrapped about the opposite second sides 72 of the second bridge 64 adjacent to the seventh pair of strain gauges. As such, utilizing the circuit device 22 provides an efficient way to align the third, fourth, seventh and eighth pairs of strain gauges to the opposite first and second sides 70, 72 of the second bridge 64. Generally, folding 3062 the fourth strip 86 about the second bridge 64 to the third position occurs after guiding 3042, 3044 the first and second strips 36, 74 in the second position about the first and second bridges 62, 64 respectively.

In certain embodiments, the first and second bridges 62, 64 each define the first slot 66 and the second slot 68. Generally, due to the width of the first and second slots 66, 68 of the first and second bridges 62, 64, the first and second strips 36, 74 are folded to the second position by the first jig 120 before utilizing the second jig 164. Therefore, guiding 3042 the first strip 36 in the second position about the first bridge 62 can include inserting the first part 142 of the first strip 36 in the second slot 68 of the first bridge 62 and inserting the second part 144 of the first strip 36 in the first slot 66 of the first bridge 62 (see FIG. 11). Similarly, guiding 3044 the second strip 74 in the second position about the second bridge 64 can include inserting the first part 142 of the second strip 74 in the second slot 68 of the second bridge 64 and inserting the second part 144 of the second strip 74 in the first slot 66 of the second bridge 64 (see FIG. 11).

Referring to FIGS. 8 and 12, furthermore, the method 3000 can include inserting 3064 a first insert 198 into the first slot 66 of the first bridge 62 to sandwich the first strip 36 between the first insert 198 and the first bridge 62, and inserting 3066 a second insert 200 into the first slot 66 of the second bridge 64 to sandwich the second strip 74 between the second insert 200 and the second bridge 64. Generally, the first insert 198 is inserted into the first slot 66 of the first bridge 62 while the first strip 36 is in the second position and the second insert 200 is inserted into the first slot 66 of the second bridge 64 while the second strip 74 is in the second position.

The first insert 198 can be defined as a first wedge 202 inserted into the first slot 66 of the first bridge 62 and the second insert 200 can be defined as a second wedge 204 inserted into the first slot 66 of the second bridge 64. In certain embodiments, the first and second wedges 202, 204 are substantially the same configuration. Therefore, the first and second wedges 202, 204 can each include a grip 206 for inserting 3064, 3066 and removing the first and second inserts 198, 200 from the first slot 66 of the first and second bridges 62, 64 respectively.

Furthermore, the first and second wedges 202, 204 can each include an extension 208 extending from the respective grip 206 to a distal end 210. The distal end 210 of each of the wedges 202, 204 can taper or be in any other suitable configuration. In certain embodiments, the distal end 210 of the first wedge 202 abuts the second projection 182 of the first set of guides 178 when inserted into the first slot 66 of the first bridge 62, and similarly, the distal end 210 of the second wedge 204 abuts the second projection 182 of the second set of guides 186 when inserted into the first slot 66 of the second bridge 64. More specifically, when the first wedge 202 is disposed in the first slot 66 of the first bridge 62, the extension 208 of the first wedge 202 engages or abuts the first strip 36, and similarly, when the second wedge 204 is disposed in the first slot 66 of the second bridge 64, the extension 208 of the second wedge 204 engages or abuts the second strip 74. It is to be appreciated that the first and second wedges 202, 204 can be different configurations from each other or any suitable configuration.

In certain embodiments, the first and second wedges 202, 204 are formed of metal. In one embodiment, the first and second wedges 202, 204 are formed of an alloy. One suitable alloy is an aluminum alloy. It is to be appreciated that the first and second wedges 202, 204 can be formed of any suitable metal or material. It is to further be appreciated that, optionally, a release agent can be applied to the first wedge 202 to minimize bonding of the first wedge 202 to the first strip 36, and similarly, the release agent can be applied to the second wedge 204 to minimize bonding of the second wedge 204 to the second strip 74. Generally, the release agent is applied to the first wedge 202 before inserting 3064 the first insert 198, and more specifically the first wedge 202, into the first slot 66 of the first bridge 62. Likewise, the release agent is applied to the second wedge 204 before inserting 3066 the second insert 200, and more specifically the second wedge 204, into the first slot 66 of the second bridge 64. In other words, the release agent minimizes bonding of excess adhesive 188 to the first and second wedges 202, 204. Similarly, the release agent as discussed above for the second jig 164 minimizes bonding of excess adhesive 188 to the second jig 164.

In various embodiments, a cover 212 (see FIG. 12) can be attached to each of the first and second inserts 198, 200, and more specifically, attached to each of the first and second wedges 202, 204 to minimize bonding of the first wedge 202 to the first strip 36 and minimize bonding of the second wedge 204 to the second strip 74. Therefore, the method 3000 can further include attaching 3068 the cover 212 to the first wedge 202 and attaching 3070 the cover 212 to the second wedge 204. More specifically, the cover 212 is disposed over the extension 208 of each of the first and second wedges 202, 204. As such, attaching 3068 the cover 212 to the first wedge 202 can include attaching the cover 212 to the extension 208 of the first wedge 202, and similarly, attaching 3070 the cover 212 to the second wedge 204 can include attaching the cover 212 to the extension 208 of the second wedge 204. Generally, attaching 3068 the cover 212 to the first wedge 202 occurs before inserting 3064 the first insert 198 into the first slot 66 of the first bridge 62. Likewise, attaching 3070 the cover 212 to the second wedge 204 occurs before inserting 3066 the second insert 200 into the first slot 66 of the second bridge 64.

Excess adhesive 188 could prevent the first wedge 202 from being removed from the first slot 66 of the first bridge 62; therefore, the cover 212 of the first wedge 202 minimizes bonding of excess adhesive 188 to the first wedge 202. Similarly, excess adhesive 188 could prevent the second wedge 204 from being removed from the first slot 66 of the second bridge 64; therefore, the cover 212 of the second wedge 204 minimizes bonding of excess adhesive 188 to the second wedge 204. As such, any excess adhesive 188 bonds to the cover 212 of the first and second wedges 202, 204 instead of directly to the first and second wedges 202, 204. The wedges 202, 204 can be removed from the respective cover 212 and thus the first slots 66 of the first and second bridges 62, 64 respectively even if adhesive 188 bonds to the cover 212. If adhesive 188 bonds to the cover 212, the cover 212 can be carefully removed or detached from the circuit device 22 after removing the wedges 202, 204 from the first slot 66 of the first and second bridges 62, 64.

In one embodiment, the covers 212 are tape. One example of a suitable tape is commercially available under the trade name Kapton® from E.I. du Pont de Nemours and Company of Wilmington, Del. In certain embodiments, the tape is formed of a polyimide film and silicon adhesive. Generally, the tape is temperature resistant to withstand the heating process as discussed above for the method 2000 and briefly discussed below. For example, the tape is temperature resistant such that the tape does not melt at temperatures below about 165° C. It is to be appreciated that any suitable temperature resistant cover can be utilized to minimize bonding of excess adhesive 188 to the first and second wedges 202, 204. For example, tape formed of Teflon® commercially available from E.I. du Pont de Nemours and Company of Wilmington, Del. can be utilized to minimize bonding of excess adhesive 188 to the first and second wedges 202, 204.

In various embodiments, the first and second inserts 198, 200 can each further include a shim 214. The shim 214 of the first insert 198 can be inserted into the first slot 66 of the first bridge 62 and sandwiched between the extension 208 of the first wedge 202 and the second portion 56 of the support 52. Therefore, the method 3000 can further include inserting 3072 the shim 214 of the first insert 198 into the first slot 66 of the first bridge 62 to sandwich the shim 214 of the first insert 198 between the extension 208 of the first wedge 202 and the second portion 56 of the support 52. The shim 214 of the first insert 198 sandwiches the first strip 36 between the extension 208 of the first wedge 202 and the first bridge 62. Generally, inserting 3072 the shim 214 of the first insert 198 into the first slot 66 of the first bridge 62 occurs after inserting the first wedge 202 into the first slot 66 of the first bridge 62.

Similarly, the shim 214 of the second insert 200 can be inserted into the first slot 66 of the second bridge 64 and sandwiched between the extension 208 of the second wedge 204 and the second portion 56 of the support 52. Thus, the method 3000 can further include inserting 3074 the shim 214 of the second insert 200 into the first slot 66 of the second bridge 64 to sandwich the shim 214 of the second insert 200 between the extension 208 of the second wedge 204 and the second portion 56 of the support 52. As such, the shim 214 of the second insert 200 sandwiches the second strip 74 between the extension 208 of the second wedge 204 and the second bridge 64. Generally, inserting 3074 the shim 214 of the second insert 200 into the first slot 66 of the second bridge 64 occurs after inserting the second wedge 204 into the first slot 66 of the second bridge 64. In certain embodiments, the shim 214 of the first and second inserts 198, 200 are substantially the same configuration. It is to be appreciated that the shim 214 of the first and second inserts 198, 200 can be different configurations from each other or any suitable configuration.

In certain embodiments, the shim 214 of the first and second inserts 198, 200 are formed of an elastomer. One suitable elastomer is rubber. It is to be appreciated that the shim 214 of the first and second inserts 198, 200 can be formed of any suitable elastomer or material.

Furthermore, the method 3000 can include inserting 3076 a third insert 216 into the second slot 68 of the first bridge 62 to sandwich the first strip 36 between the first bridge 62 and the third insert 216, and inserting 3078 a fourth insert 218 into the second slot 68 of the second bridge 64 to sandwich the second strip 74 between the second bridge 64 and the fourth insert 218. Generally, the third insert 216 is inserted into the second slot 68 of the first bridge 62 while the first strip 36 is in the second position. Likewise, generally, the fourth insert 218 is inserted into the second slot 68 of the second bridge 64 while the second strip 74 is in the second position. It is to be appreciated that inserting 3076 the third insert 216 can occur before or after inserting 3078 the fourth insert 218 or inserting 3076 the third insert 216 and inserting 3078 the fourth insert 218 can occur simultaneously.

In certain embodiments, the third and fourth inserts 216, 218 can each be defined as a shim. In certain embodiments, the shim of the third and fourth inserts 216, 218 are formed of an elastomer. One suitable elastomer is rubber. It is to be appreciated that the shim of the third and fourth inserts 216, 218 can be formed of any suitable elastomer or material.

Continuing with FIG. 12, the method 3000 can further include attaching 3080 a first retainer 220 to the first strip 36 to secure the first strip 36 in the third position and attaching 3082 a second retainer 222 to the second strip 74 to secure the second strip 74 in the third position. Furthermore, the method 3000 can include attaching 3084 the third retainer 224 to the third strip 80 to secure the third strip 80 in the third position and attaching 3086 the fourth retainer 226 to the fourth strip 86 to secure the fourth strip 86 in the third position. Generally, attaching 3080, 3082 the first and second retainers 220, 222 to the first and second strips 36, 74 respectively occurs after inserting 3064, 3066 the first and second inserts 198, 200 into the first slot 66 of the first and second bridges 62, 64 respectively. In addition, attaching 3080, 3082 the first and second retainers 220, 222 to the first and second strips 36, 74 respectively occurs after inserting 3076, 3078 the third and fourth inserts 216, 218 into the second slot 68 of the first and second bridges 62, 64.

More specifically, attaching 3080 the first retainer 220 to the first strip 36 can include attaching the first retainer 220 to the first strip 36 and at least one of the first bridge 62 and the extension 208 of the first wedge 202 to secure the first strip 36 in the third position. In certain embodiments, the first retainer 220 is attached to the first strip 36, the first bridge 62 and the extension 208 of the first wedge 202 as shown in FIG. 12. Furthermore, attaching 3082 the second retainer 222 to the second strip 74 can include attaching the second retainer 222 to the second strip 74 and at least one of the second bridge 64 and the extension 208 of the second wedge 204 to secure the second strip 74 in the third position. In certain embodiments, the second retainer 222 is attached to the second strip 74, the second bridge 64 and the extension 208 of the second wedge 204 as shown in FIG. 12.

In addition, attaching 3084 the third retainer 224 to the third strip 80 can include attaching the third retainer 224 to the third strip 80 and at least one of the first bridge 62 and the second projection 182 of the first set of guides 178 to secure the third strip 80 in the third position. In certain embodiments, the third retainer 224 is attached to the third strip 80, the first bridge 62 and the second projection 182 of the first set of guides 178 as shown in FIG. 12. Furthermore, attaching 3086 the fourth retainer 226 to the fourth strip 86 can include attaching the fourth retainer 226 to the fourth strip 86 and at least one of the second bridge 64 and the second projection 182 of the second set of guides 186 to secure the fourth strip 86 in the third position. In certain embodiments, the fourth retainer 226 is attached to the fourth strip 86, the second bridge 64 and the second projection 182 of the second set of guides 186 as shown in FIG. 12.

In one embodiment, the first, second, third and fourth retainers 220, 222, 224, 226 are tape. One example of a suitable tape is commercially available under the trade name Kapton® from E.I. du Pont de Nemours and Company of Wilmington, Del. In certain embodiments, the tape is formed of a polyimide film and silicon adhesive. Generally, the tape is temperature resistant to withstand the heating process discussed above for the method 2000 and briefly discussed below. For example, the tape is temperature resistant such that the tape does not melt at temperatures below about 165° C. It is to be appreciated that any suitable temperature resistant retainer can be utilized to secure the first, second, third and fourth strips 36, 74, 80, 86 in the third position or the second folded position. For example, tape formed of Teflon® commercially available from E.I. du Pont de Nemours and Company of Wilmington, Del. can be utilized to secure the first, second, third and fourth strips 36, 74, 80, 86 in the third position. Details discussed here for the third and fourth retainers 224, 226 are also applicable above for the method 2000.

Furthermore, the method 3000 can include attaching 3088 the top part 190 (see FIGS. 8 and 13) of the second jig 164 to the bottom part 166 of the second jig 164 while the first, second, third and fourth strips 36, 74, 80, 86 are in the third position. In other words, attaching 3088 the top part 190 of the second jig 164 to the bottom part 166 of the second jig 164 occurs after attaching 3080, 3082, 3084, 3086 the first, second, third and fourth retainers 220, 222, 224, 226 to the first, second, third and fourth strips 36, 74, 80, 86 respectively. Additional details of the top part 190 are discussed above in the method 2000 and will not be re-discussed.

Figure 13:
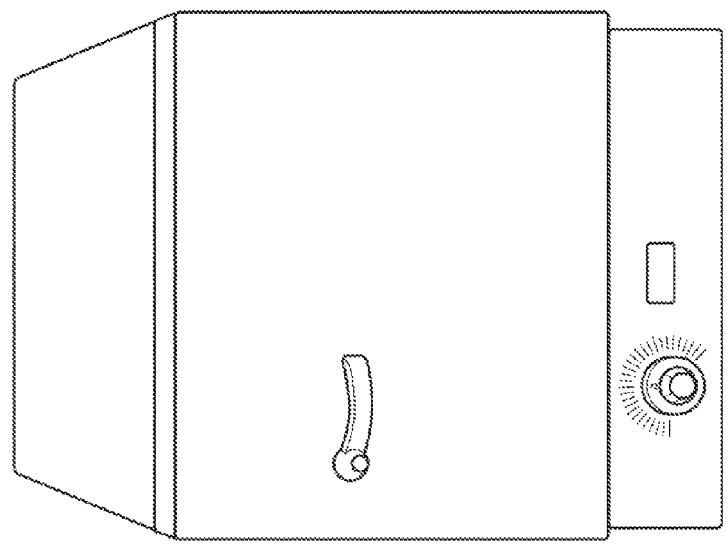
FIG. 13 is a schematic perspective view of a top part of the second jig attached to the bottom part of the second jig.

Referring to FIG. 13, a fifth retainer 228 can be utilized to secure the top part 190 to the bottom part 166. Therefore, the method 3000 can include attaching 3090 the fifth retainer 228 to the top port 190 and the bottom part 166 to secure together the bottom and top parts 166, 190. The fifth retainer 228 can be tape as discussed above for the first, second, third and fourth retainers 220, 222, 224, 226. It is to be appreciated that any suitable retainer can be utilized to attach or secure the top part 190 to the bottom part 166. It is to be appreciated that the fifth retainer 228 can be utilized in the method 2000.

Briefly, the method 3000 can further include heating 3092 the second jig 164 including the top and bottom parts 190, 166, the circuit device 22 and the support 52 in the heater 108 (see FIG. 14) and cooling 3094 the second jig 164 including the top and bottom parts 190, 166, the circuit device 22 and the support 52. Heating 3092 the second jig 164 cures the adhesive 188 to secure the first and third strips 36, 80 to the first bridge 62 and to secure the second and fourth strips 74, 86 to the second bridge 64. Generally, cooling 3094 the second jig 164, the circuit device 22, etc. occurs after heating 3092 the second jig 164, the circuit device 22, etc. Additional details of the heating and cooling the second jig 164, etc., such as temperature, time, etc., are discussed above in the method 2000 and will be not re-discussed.

Furthermore, the method 3000 can include removing 3096 the support 52 and the circuit device 22 from the second jig 164 as the load cell assembly 20, with the first, second, third and fourth strips 36, 74, 80, 86 remaining in the third position such that the first and third strips 36, 80 are wrapped about the first bridge 62 and the second and fourth strips 74, 86 are wrapped about the second bridge 64. Simply stated, the modular unit is removed from the second jig 164. The first and third strain gauges 34, 82 surround the first bridge 62 and the second and fourth strain gauges 76, 88 surround the second bridge 64 when the load cell assembly 20 is removed from the second jig 164. As such, utilizing the circuit device 22 provides an efficient way to align the strain gauges 34, 76, 82, 88 to the first and second sides 70, 72 of the first and second bridges 62, 64. In other words, the first, second, third and fourth strips 36, 74, 80, 86 provide accurate placement of the strain gauges 34, 76, 82, 88 around the first and second bridges 62, 64. Hence, the placement of the strain gauges 34, 76, 82, 88 is provided with a uniform process, and therefore, the placement of the strain gauges 34, 76, 82, 88 is consistent. Furthermore, the process of manufacturing load cell assemblies 20 utilizing the first and second jigs 120, 164 is repeatable and thus will provide consistent placement of the strain gauges 34, 76, 82, 88 around the first and second bridges 62, 64. In addition, manufacturing the load cell assemblies 20 can be performed by a manual process or an automated process.

Removing 3096 the support 52 and the circuit device 22 from the second jig 164, and specifically removing the load cell assembly 20 from the second jig 164, can include removing the first and second rods 150, 152 from the second and third holes 176, 194 of the top and bottom parts 190, 166. In addition, removing 3096 the support 52 and the circuit device 22 from the second jig 164, and specifically removing the load cell assembly 20 from the second jig 164, can further include detaching the fifth retainer 228 from the top and bottom parts 190, 166 to detach the top part 190 from the bottom part 166 of the second jig 164. In certain embodiments, removing the first and second rods 150, 152 from the second and third holes 176, 194 of the top and bottom part 190, 166 occurs before detaching the fifth retainer 228 from the top and bottom parts 190, 166. It is to be appreciated that detaching the fifth retainer 228 can occur before removing the first and second rods 150, 152 from the second and third holes 176, 194.

Figure 17:
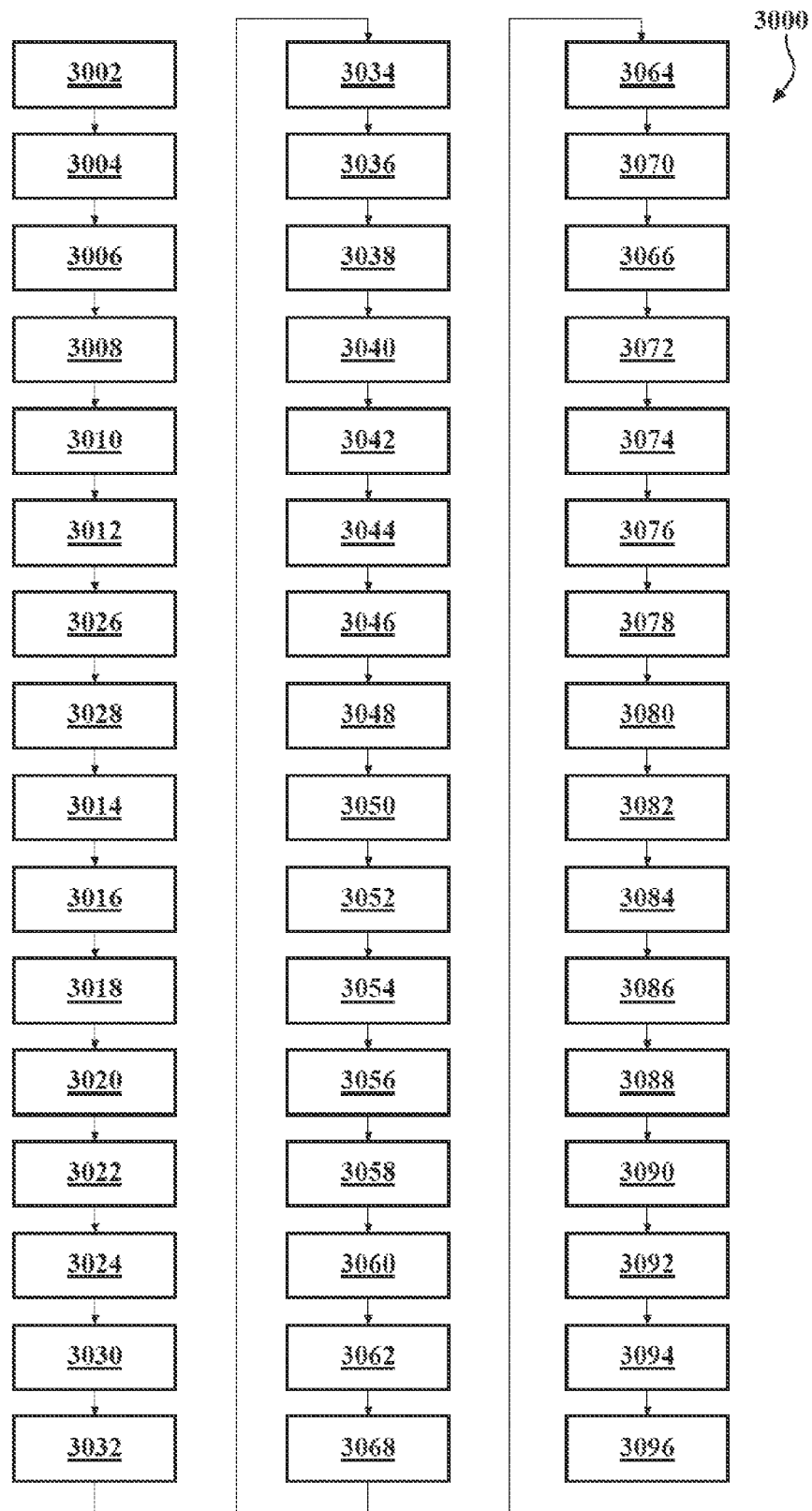
FIG. 17 is a schematic flowchart of a method of manufacturing the load cell assembly of FIGS. 6-13.

More specifically, removing 3096 the support 52 and the circuit device 22 from the second jig 164, and specifically removing the load cell assembly 20 from the second jig 164, can include separating the top and bottom parts 190, 166 to remove the load cell assembly 20 from the bottom part 166. In addition, removing 3096 the support 52 and the circuit device 22 from the second jig 164, and specifically removing the load cell assembly 20 from the second jig 164, can include detaching the first, second, third and fourth retainers 220, 222, 224, 226 from the first, second, third and fourth strips 36, 74, 80, 86 respectively after separating the top and bottom parts 190, 166. Furthermore, removing 3096 the support 52 and the circuit device 22 from the second jig 164, and specifically removing the load cell assembly 20 from the second jig 164, can include removing the first, second, third and fourth inserts 198, 200, 216, 218 from the first and second slots 66, 68 of the first and second bridges 62, 64. Generally, detaching the first, second, third and fourth retainers 220, 222, 224, 226 from the first, second, third and fourth strips 36, 74, 80, 86 occurs before removing the first, second, third and fourth inserts 198, 200, 216, 218 from the first and second slots 66, 68. In addition, removing 3096 the support 52 and the circuit device 22 from the second jig 164, and specifically removing the load cell assembly 20 from the second jig 164, can include disengaging the load cell assembly 20 from the bottom part 166. It is to be appreciated that the order or sequence of performing the method 3000 as identified in the flowchart of FIG. 17 is for illustrative purposes and other orders or sequences are within the scope of the present disclosure. It is to also be appreciated that the method 3000 can include other features not specifically identified in the flowchart of FIG. 17.

While the best modes for carrying out the disclosure have been described in detail, those familiar with the art to which this disclosure relates will recognize various alternative designs and embodiments for practicing the disclosure within the scope of the appended claims.

The invention claimed is:

1. A method of manufacturing a load cell assembly, the method comprising:
   providing a flexible circuit body including a strip having a plurality of hinges, with the strip being in a first position;
   attaching a plurality of strain gauges to the strip to define a circuit device, with one of the hinges disposed between each of the strain gauges;
   providing a first jig including a mid-portion and a finger extending from the mid-portion to define a first pattern;
   abutting the circuit device to the mid-portion of the first pattern, with the strip remaining in the first position;
   folding the strip of the flexible circuit body about the finger along at least one of the hinges to define a second position of the strip;
   removing the circuit device from the first jig, with the strip remaining in the second position;
   providing a second jig including a bottom part defining a second pattern;
   providing a support including a first portion, a second portion and a bridge disposed between the first and second portions;
   guiding the strip in the second position about the bridge of the support;
   sandwiching the circuit device between the support and the second pattern of the bottom part such that the flexible circuit body abuts at least one of the first and second portions of the support, with the strip remaining in the second position about the bridge; and
   folding the strip about the bridge along another one of the hinges to define a third position of the strip such that the strip is wrapped about the bridge when in the third position to align the strain gauges about the bridge and to attach the circuit device and the support to each other to define the load cell assembly.

2. The method as set forth in claim 1 wherein folding the strip of the flexible circuit body about the finger along at least one of the hinges includes engaging the strip with a first tool to fold the strip about the finger along a pair of the hinges to further define the second position of the strip.

3. The method as set forth in claim 2 wherein the first tool is a fork including a first arm, a second arm and a base disposed between the first and second arms to define a space between the first and second arms, and wherein the finger includes a first side, a second side and a third side disposed between the first and second sides and wherein engaging the strip with the first tool includes:
   engaging a first part of the strip with the first arm to move the first part between the first side and the first arm;
   bending one of the hinges as the first part moves between the first side and the first arm;
   engaging a second part of the strip with the second arm to move the second part between the second side and the second arm;
   bending another one of the hinges as the second part moves between the second side and the second arm; and
   disposing a third part of the strip in the space between the base and the third side.

4. The method as set forth in claim 2 wherein the mid-portion of the first jig defines a plurality of holes to further define the first pattern and the flexible circuit body includes a middle portion defining a plurality of apertures, and further comprising:
   inserting a first rod through one of the holes and one of the apertures to secure the circuit device to the mid-portion of the first jig; and
   inserting a second rod through another one of the holes and another one of the apertures to align the circuit device relative to the first pattern.

5. The method as set forth in claim 4 further comprising:
   securing the strip in the second position with the first tool;
   heating the first jig, the first tool, the first and second rods and the circuit device in a heater, with the strip being in the second position;
   cooling the first jig, the first tool, the first and second rods and the circuit device, with the strip being in the second position, and wherein cooling the first jig occurs after heating the first jig; and
   wherein removing the circuit device from the first jig, with the strip remaining in the second position, occurs after cooling the first jig.

6. The method as set forth in claim 1 wherein the strip is further defined as a first strip, the hinges are further defined as first hinges, the strain gauges are further defined as a plurality of first strain gauges, and the flexible circuit body further includes a second strip having a plurality of second hinges, a third strip having a plurality of third hinges and a fourth strip having a plurality of fourth hinges;
   wherein attaching the strain gauges to the strip includes attaching the first strain gauges to the first strip, with one of the first hinges disposed between each of the first strain gauges, and with the first strip being in the first position;
   further comprising:
      attaching a plurality of second strain gauges to the second strip, with one of the second hinges disposed between each of the second strain gauges, and with the second strip being in a first position;
      attaching a plurality of third strain gauges to the third strip, with one of the third hinges disposed between each of the third strain gauges, and with the third strip being in a first position;
      attaching a plurality of fourth strain gauges to the fourth strip, with one of the fourth hinges disposed between each of the fourth strain gauges, and with the fourth strip being in a first position; and
wherein the first, second, third and fourth strips and the first, second, third and fourth strain gauges further define the circuit device.

7. The method as set forth in claim 6 wherein the finger of the first pattern is further defined as a first finger, and wherein the mid-portion of the first jig further includes a second finger extending from the mid-portion to further define the first pattern;
wherein folding the strip of the flexible circuit body about the finger along at least one of the hinges include folding the first strip of the flexible circuit body about the first finger along at least one of the first hinges to define the second position of the first strip;
further comprising:
folding the second strip of the flexible circuit body about the second finger along at least one the second hinges to define a second position of the second strip; and
maintaining the third and fourth strips in the first position while folding the first and second strips about the first and second fingers respectively.

8. The method as set forth in claim 7:
wherein folding the first strip of the flexible circuit body about the first finger along at least one of the first hinges include engaging the first strip with a first tool to fold the first strip about the first finger along a pair of the first hinges to further define the second position;
wherein folding the second strip of the flexible circuit body about the second finger along at least one the second hinges include engaging the second strip with a second tool to fold the second strip about the second finger along a pair of the second hinges to further define the second position;
further comprising:
heating the first jig, the first and second tools and the circuit device in a heater, with the first and second strips being in the second position, and with the third and fourth strips being in the first position; and
cooling the first jig, the first and second tools and the circuit device, with the first and second strips being in the second position, and with the third and fourth strips being in the first position, and wherein cooling the first jig occurs after heating the first jig; and
wherein removing the circuit device from the first jig includes removing the circuit device from the first jig, with the first and second strips remaining in the second position, and with the third and fourth strips remaining in the first position, and wherein removing the circuit device from the first jig occurs after cooling the first jig.

9. The method as set forth in claim 7 wherein the bridge is further defined as a first bridge, and wherein the support further includes a third portion and a second bridge disposed between the second and third portions;
wherein guiding the strip in the second position about the bridge of the support includes guiding the first strip in the second position about the first bridge of the support; and
wherein folding the strip about the bridge along another one of the hinges to define the third position of the strip includes folding the first strip about the first bridge along another one of the first hinges to define the third position of the first strip such that the first strip is wrapped about the first bridge when in the third position to align the first strain gauges about the first bridge and to attach the circuit device and the support to each other;

further comprising:
guiding the second strip in the second position about the second bridge of the support; and
folding the second strip about the second bridge along another one of the second hinges to define a third position of the second strip such that the second strip is wrapped about the second bridge when in the third position to align the second strain gauges about the second bridge and to attach the circuit device and the support to each other.

10. The method as set forth in claim 9 wherein the first and second bridges each define a first slot and a second slot, and further comprising:
inserting a first insert into the first slot of the first bridge to sandwich the first strip between the first insert and the first bridge;
inserting a second insert into the first slot of the second bridge to sandwich the second strip between the second insert and the second bridge;
inserting a third insert into the second slot of the first bridge to sandwich the first strip between the first bridge and the third insert; and
inserting a fourth insert into the second slot of the second bridge to sandwich the second strip between the second bridge and the fourth insert.

11. The method as set forth in claim 9 wherein the bottom part includes a first side portion, a second side portion and a center portion disposed between the first and second side portions, with the first side portion including a first set of guides and the second side portion including a second set of guides to further define the second pattern, and further comprising:
folding the third strip about the first bridge along at least one of the third hinges as the circuit device is sandwiched between the support and the second pattern of the bottom part to define a second position of the third strip, and folding the third strip includes engaging the third strip with the first set of guides as the circuit device is sandwiched between the support and the second pattern of the bottom part to fold the third strip along a pair of the third hinges about the first bridge to further define the second position of the third strip; and
folding the fourth strip about the second bridge along at least one of the fourth hinges as the circuit device is sandwiched between the support and the second pattern of the bottom part to define a second position of the fourth strip, and folding the fourth strip includes engaging the fourth strip with the second set of guides as the circuit device is sandwiched between the support and the second pattern of the bottom part to fold the fourth strip along a pair of the fourth hinges about the second bridge to further define the second position of the fourth strip.

12. The method as set forth in claim 11 further comprising:
folding the third strip about the first bridge along another one of the third hinges to define a third position of the third strip such that the third strip is wrapped about the first bridge when in the third position to align the third strain gauges about the first bridge and to attach the circuit device and the support to each other; and
folding the fourth strip about the second bridge along another one of the fourth hinges to define a third position of the fourth strip such that the fourth strip is wrapped about the second bridge when in the third position to align the fourth strain gauges about the second bridge and attach the circuit device and the support to each other.

13. The method as set forth in claim 12 further comprising:
applying adhesive to the flexible circuit body, with the adhesive facing the support to attach the circuit device and the support to each other;
attaching a first retainer to the first strip to secure the first strip in the third position;
attaching a second retainer to the second strip to secure the second strip in the third position;
attaching a third retainer to the third strip to secure the third strip in the third position; and
attaching a fourth retainer to the fourth strip to secure the fourth strip in the third position.

14. The method as set forth in claim 12 further comprising:
attaching a top part of the second jig to the bottom part of the second jig while the first, second, third and fourth strips are in the third position;
heating the second jig including the top and bottom parts, the circuit device and the support in a heater;
cooling the second jig including the top and bottom parts, the circuit device and the support, and wherein cooling the second jig occurs after heating the second jig; and
removing the support and the circuit device from the second jig as the load cell assembly, with the first, second, third and fourth strips remaining in the third position such that the first and third strips are wrapped about the first bridge and the second and fourth strips are wrapped about the second bridge, and with the first and third strain gauges surrounding the first bridge and the second and fourth strain gauges surrounding the second bridge.

15. The method of folding a circuit device, the method comprising:
providing a flexible circuit body including a strip having a hinge, with the strip being in a first position;
attaching a plurality of strain gauges to the strip to define the circuit device, with the hinge disposed between a pair of the strain gauges;
providing a jig including a mid-portion and a finger extending from the mid-portion to define a pattern;
abutting the flexible circuit body to the mid-portion of the pattern, with the strip remaining in the first position;
folding the strip of the flexible circuit body about the finger along the hinge to define a second position of the strip; and
removing the flexible circuit body, including the strain gauges, from the jig, with the strip remaining in the second position.

16. The method as set forth in claim 15 wherein the hinge is further defined as a plurality of hinges such that one of the hinges is disposed between each of the strain gauges, wherein the finger includes a first side, a second side and a third side disposed between the first and second sides, and further including a fork having a first arm, a second arm and a base disposed between the first and second arms to define a space between the first and second arms;
wherein folding the strip of the flexible circuit body includes:
engaging a first part of the strip with the first arm to move the first part between the first side and the first arm;
bending one of the hinges as the first part moves between the first side and the first arm;
engaging a second part of the strip with the second arm to move the second part between the second side and the second arm;
bending another one of the hinges as the second part moves between the second side and the second arm;
disposing a third part of the strip in the space between the base and the third side; and
further including securing the strip in the second position with the fork.

17. The method as set forth in claim 16 wherein the mid-portion defines a plurality of holes to further define the pattern and the flexible circuit body includes a middle portion defining a plurality of apertures, and further comprising:
inserting a first rod through one of the holes and one of the apertures to secure the flexible circuit body including the strain gauges, to the mid-portion of the jig;
inserting a second rod through another one of the holes and another one of the apertures to align the flexible circuit body including the strain gauges, relative to the pattern;
heating the jig, the fork, the first and second rods and the flexible circuit body including the strain gauges, in a heater, with the strip being in the second position; and
cooling the jig, the fork, the first and second rods and the flexible circuit body including the strain gauges, with the strip being in the second position, and wherein cooling the jig occurs after heating the jig,
wherein removing the flexible circuit body, including the strain gauges, from the jig, with the strip remaining in the second position, occurs after cooling the jig.

18. The method of folding a circuit device, the method comprising:
providing a flexible circuit body including a strip having a plurality of hinges, with the strip being in an unfolded position;
attaching a plurality of strain gauges to the strip to define the circuit device, with one of the hinges disposed between each of the strain gauges;
providing a jig including a bottom part defining a pattern;
providing a support including a first portion, a second portion and a bridge disposed between the first and second portions;
sandwiching the flexible circuit body including the strain gauges, between the support and the pattern of the bottom part such that the flexible circuit body abuts at least one of the first and second portions of the support;
folding the strip about the bridge along at least one of the hinges as the flexible circuit body is sandwiched between the support and the pattern of the bottom part to define a first folded position of the strip; and
folding the strip along another one of the hinges to define a second folded position of the strip such that the strip is wrapped about the bridge when in the second folded position to align the strain gauges about the bridge and to attach the flexible circuit body and the support to each other to define a load cell assembly.

19. The method as set forth in claim 18 wherein the bottom part includes a set of guides to further define the pattern, and wherein folding the strip about the bridge along at least one of the hinges includes engaging the strip with the set of guides as the flexible circuit body is sandwiched between the support and the pattern of the bottom part to fold the strip along a pair of the hinges to further define the first folded position.

20. The method as set forth in claim 18 further comprising:
applying adhesive to the flexible circuit body, with the adhesive facing the support to attach the flexible circuit body and the support to each other;
attaching a retainer to the strip to secure the strip in the second folded position;
attaching a top part of the jig to the bottom part of the jig while the strip is in the second folded position;
heating the jig including the top and bottom parts, the flexible circuit body including the strain gauges and the support in the heater;

cooling the jig including the top and bottom parts, the flexible circuit body including the strain gauges and the support, and wherein cooling the jig occurs after heating the jig; and removing the support and the flexible circuit body including the strain gauges from the jig as the load cell assembly, with the strip remaining in the second folded position such that the strip is wrapped about the bridge and the strain gauges surround the bridge.

* * * * *